(12) United States Patent
Jain

(10) Patent No.: US 7,700,471 B2
(45) Date of Patent: Apr. 20, 2010

(54) METHODS OF MAKING SEMICONDUCTOR-BASED ELECTRONIC DEVICES ON A WIRE AND ARTICLES THAT CAN BE MADE THEREBY

(75) Inventor: Ajaykumar R. Jain, San Carlos, CA (US)

(73) Assignee: Versatilis, Shelburne, VT (US)

( * ) Notice: Subject to any disclaimer, the term of this patent is extended or adjusted under 35 U.S.C. 154(b) by 10 days.

(21) Appl. No.: 11/744,262

(22) Filed: May 4, 2007

(65) Prior Publication Data

US 2007/0200110 A1 Aug. 30, 2007

Related U.S. Application Data

(62) Division of application No. 11/610,195, filed on Dec. 13, 2006.

(60) Provisional application No. 60/816,671, filed on Jun. 28, 2006, provisional application No. 60/797,795, filed on May 5, 2006, provisional application No. 60/749,491, filed on Dec. 13, 2005, provisional application No. 60/851,619, filed on Oct. 16, 2006, provisional application No. 60/851,621, filed on Oct. 16, 2006, provisional application No. 60/851,431, filed on Oct. 16, 2006, provisional application No. 60/797,796, filed on May 5, 2006.

(51) Int. Cl.
*H01L 21/3205* (2006.01)
*H01L 21/4763* (2006.01)

(52) U.S. Cl. ............................. 438/587; 257/E23.024

(58) Field of Classification Search ................ 438/110, 438/142, 201, 400, 461, 462, 464, 587; 257/E23.024
See application file for complete search history.

(56) References Cited

U.S. PATENT DOCUMENTS

| 4,057,819 A | 11/1977 | Owen et al. |
| 5,789,770 A | 8/1998 | Rostoker et al. |
| 5,915,179 A | 6/1999 | Etou et al. |

(Continued)

FOREIGN PATENT DOCUMENTS

JP 10270685 10/1998

(Continued)

OTHER PUBLICATIONS

International Search Report and Written Opinion dated Jun. 18, 2008, regarding related International Application Serial No. PCT/US07/87236.

(Continued)

*Primary Examiner*—Alexander G Ghyka
*Assistant Examiner*—Seahvosh J Nikmanesh
(74) *Attorney, Agent, or Firm*—Downs Rachlin Martin PLLC

(57) ABSTRACT

Strands active electronic devices (AEDs), such as field-effect transistors, are made by processing a semiconductor substrate so that it yields a number of elongate semiconductor members liberated from the starting substrate. The elongate semiconductor members are secured to wires or wire-like structures so as to form semiconductor-member-on-a-wire composites upon which the AEDs are formed using various deposition and etching techniques. The AED strands have many uses, including the creating of electronic components, including flexible, conformal, rigid and foldable electronics, such as displays and sensors.

26 Claims, 25 Drawing Sheets

U.S. PATENT DOCUMENTS

| | | | |
|---|---|---|---|
| 6,133,146 | A | 10/2000 | Martinez-Tovar et al. |
| 6,157,049 | A | 12/2000 | Mitlehner et al. |
| 6,682,965 | B1 | 1/2004 | Noguchi et al. |
| 6,690,056 | B1 | 2/2004 | Reedy et al. |
| 6,885,028 | B2 | 4/2005 | Nishiki et al. |
| 7,005,378 | B2* | 2/2006 | Crocker et al. ............. 438/674 |
| 7,074,644 | B2 | 7/2006 | Kimura |
| 2002/0022343 | A1 | 2/2002 | Nonaka |
| 2003/0178623 | A1 | 9/2003 | Nishiki et al. |
| 2003/0180451 | A1 | 9/2003 | Kodas et al. |
| 2005/0042796 | A1 | 2/2005 | Wagner |
| 2005/0127363 | A1 | 6/2005 | Nishiki et al. |
| 2005/0127455 | A1 | 6/2005 | Nishiki et al. |
| 2006/0051401 | A1 | 3/2006 | Manohar et al. |
| 2006/0054879 | A1 | 3/2006 | Jin |
| 2006/0172470 | A1 | 8/2006 | Hara et al. |
| 2006/0175601 | A1 | 8/2006 | Lieber et al. |
| 2006/0216514 | A1 | 9/2006 | Fujimura et al. |
| 2006/0233694 | A1 | 10/2006 | Sandhu et al. |
| 2006/0246267 | A1 | 11/2006 | Jain |
| 2007/0200110 | A1 | 8/2007 | Jain |
| 2007/0278526 | A1* | 12/2007 | Jain ........................... 257/204 |
| 2008/0150025 | A1 | 6/2008 | Jain |

FOREIGN PATENT DOCUMENTS

| | | |
|---|---|---|
| JP | 2004235238 | 8/2004 |

OTHER PUBLICATIONS

Preliminary Amendment dated Jul. 8, 2008, regarding related U.S. Appl. No. 11/610,195.

International Search Report and Written Opinion dated Jan. 9, 2009, in connection with related application PCT/US2008/066632.

Preliminary Amendment dated Jun. 12, 2008, regarding related U.S. Appl. No. 11/764,420.

Office Action (Restriction Requirement) dated Nov. 12, 2008, regarding related U.S. Appl. No. 11/764,420.

Response to Office Action (Restriction Requirement) dated Dec. 11, 2008, regarding related U.S. Appl. No. 11/764,420.

Erich Gross, "Woven/Textile Integrated Displays," The Erik Jonsson School of Engineering and Computer Science, downloaded Feb. 23, 2006.

M.S. Shur, R. Gaska, S.L. Rumyantsev, R. Rimeika and J. Sinius, "Semiconductor Thin Films and Thin Film Devices for Electrotextiles," Proceedings of Workshop on Frontiers in Electronics, St. Croix, Virgin Islands, 2002.

D. Marculescu, R. Marculescu, N. Zamora, P. Stanley-Marbell, P. Khosla, S. Park, S. Jayaraman, S. Jung. C. Lauterbach, W. Weber, T. Kirstein, D. Cottet, J. Grzyb, G. Troster, M. Jones, T. Martin, Z. Nakad, "Electronic Textiles: A Platform for Pervasive Computing," Proceedings of the IEEE, vol. 91, No. 12, Dec. 2003, pp. 1995-2018.

Josephine B. Lee and Vivek Subramanian, "Weave Patterned Organic Transistors on Fiber for E-Textiles," IEEE Transactions on Electron Devices, vol. 52, No. 2, Feb. 2005, pp. 269-275.

Josephine B. Lee and Vivek Subramanian, "Organic Transistors on Fiber: A first step towards electronic textiles," 0-7803-7873-3/03 IEEE 2003.

U.S. Appl. No. 11/764,420, filed Jun. 18, 2007, entitled: Methods of Making Semiconductor-Based Electronic Devices on a Wire and Articles That Can Be Made using Such Devices; Inventor: Ajaykumar R. Jain.

U.S. Appl. No. 11/610,195, filed December 13, 2006, entitled: Method of Making Semiconductor-Based Electronic Devices on a Wire and By Forming Freestanding Semiconductor Structures; Inventor: Ajaykumar R. Jain.

Written Opinion and International Search Report dated Oct. 13, 2008, with regard to related PCT/US08/60483.

Response to First Office Action dated May 20, 2009, with regard to related U.S. Appl. No. 11/764,420.

Final Office Action dated Jul. 7, 2009 with regard to related U.S. Appl. No. 11/764,420, filed Jun. 18, 2007, Inventor: Ajaykumar R. Jain.

Response to Final Office Action dated August 17, 2009, and terminal disclaimer with regard to related U.S. Appl. No. 11/764,420, filed Jun. 18, 2007, Inventor: Ajaykumar R. Jain.

Notice of Allowance dated Sep. 16, 2009, with regard to related U.S. Appl. No. 11/764,420, filed Jun. 18, 2007, Inventor: Ajaykumar R. Jain.

First Office Action dated Apr. 16, 2009, with regard to related U.S. Appl. No. 11/764,420.

* cited by examiner

FIG. 4L
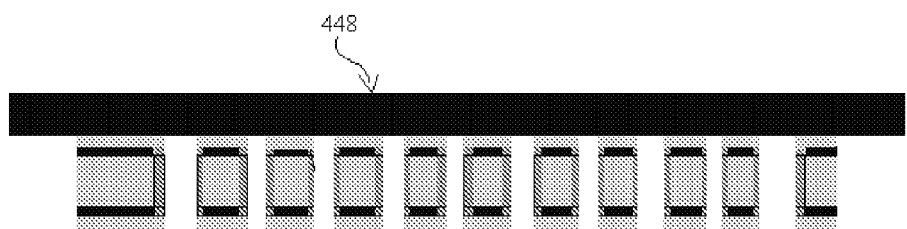
FIG. 4L'            OR
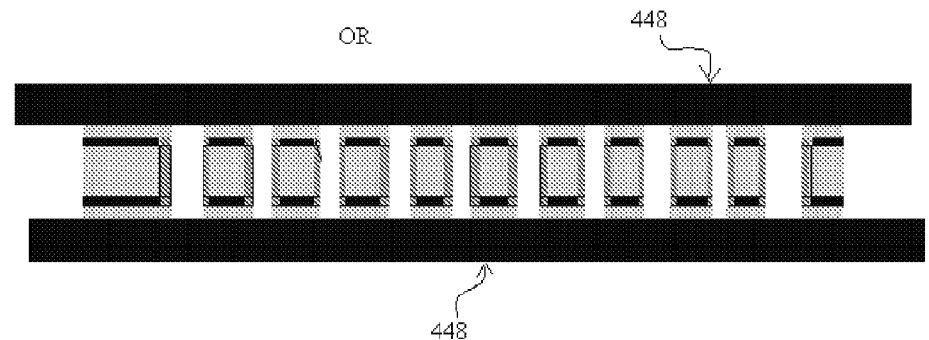
FIG. 4M
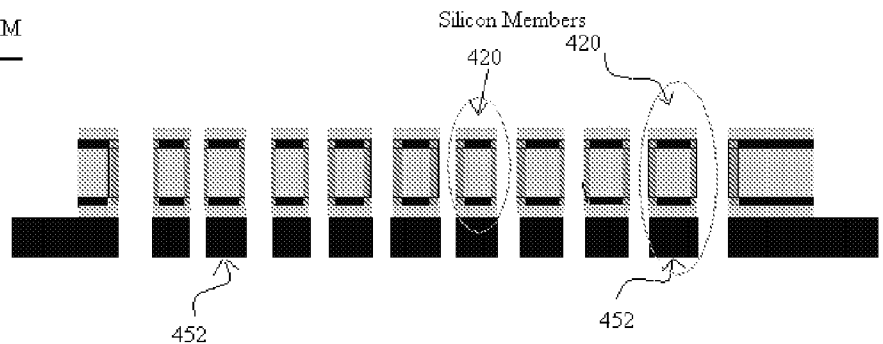
Cut conductive sheet into "wires" with silicon members Top view Side view End view End view

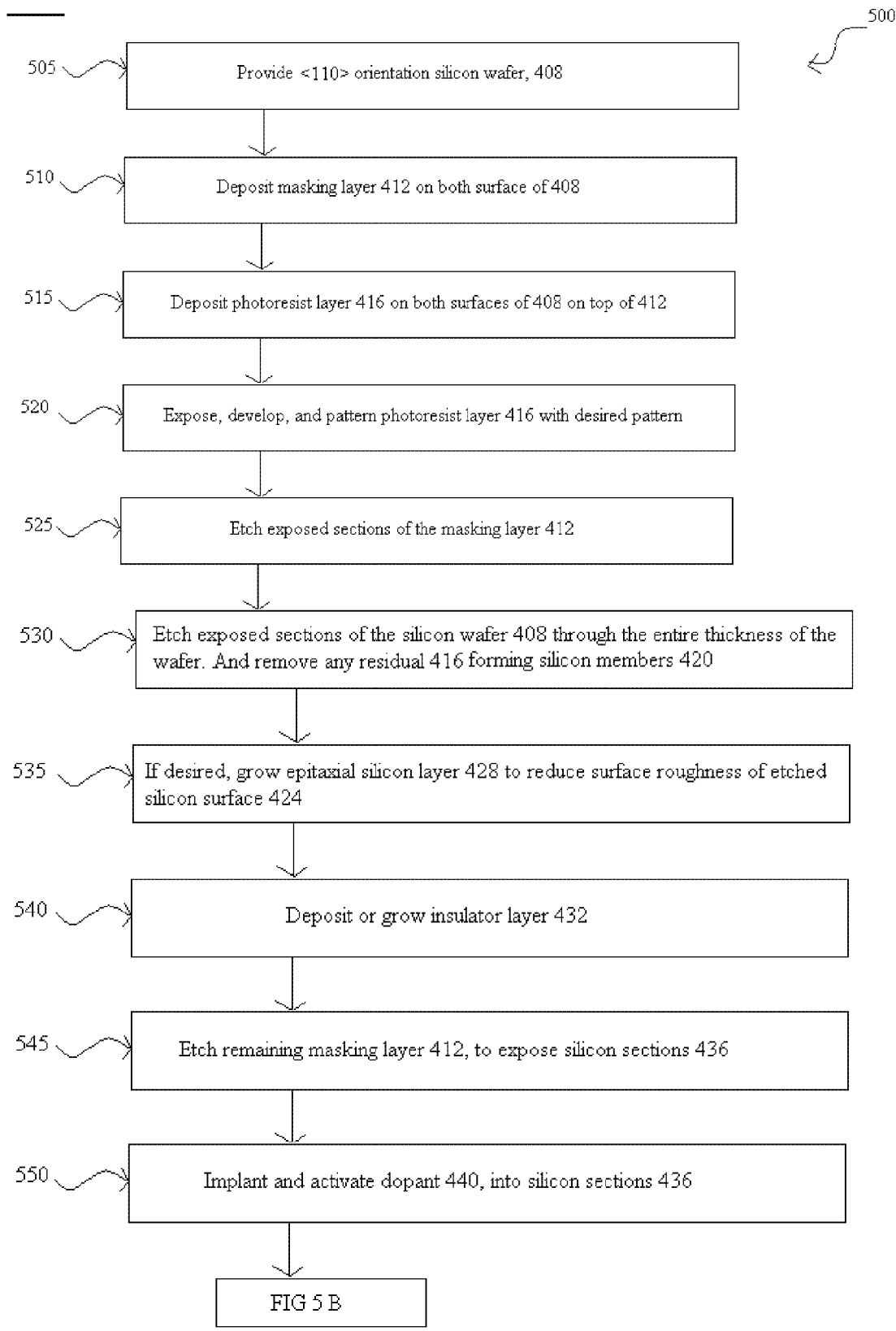

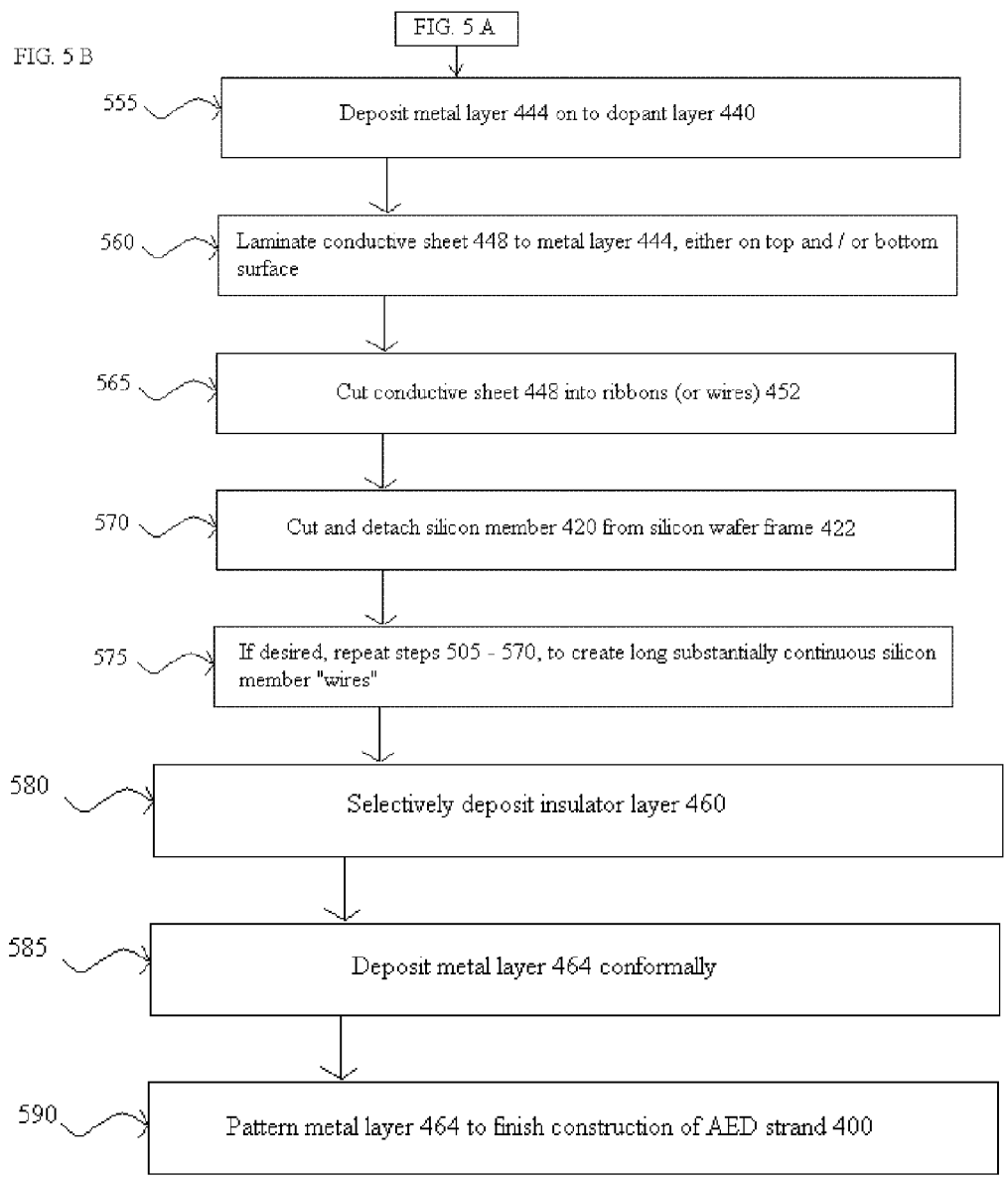

AED strands 400

Base Substrate    612    Patterned wire, the Gate metal electrode is joined to the metal electrode 608
604

400    FET 404    FET 404    464 after patterning
612
604

Side View

Transverse section

Transverse section

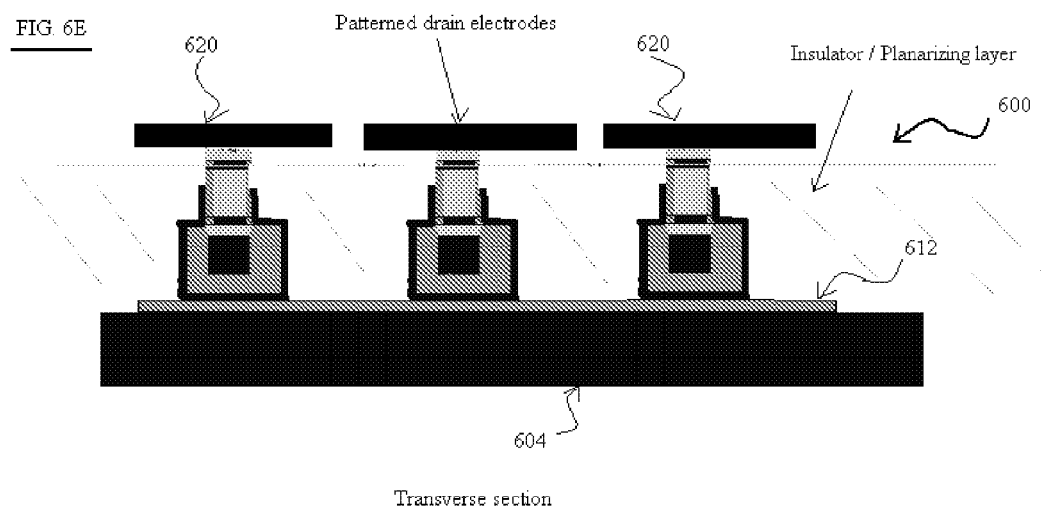
FIG. 6E Transverse section

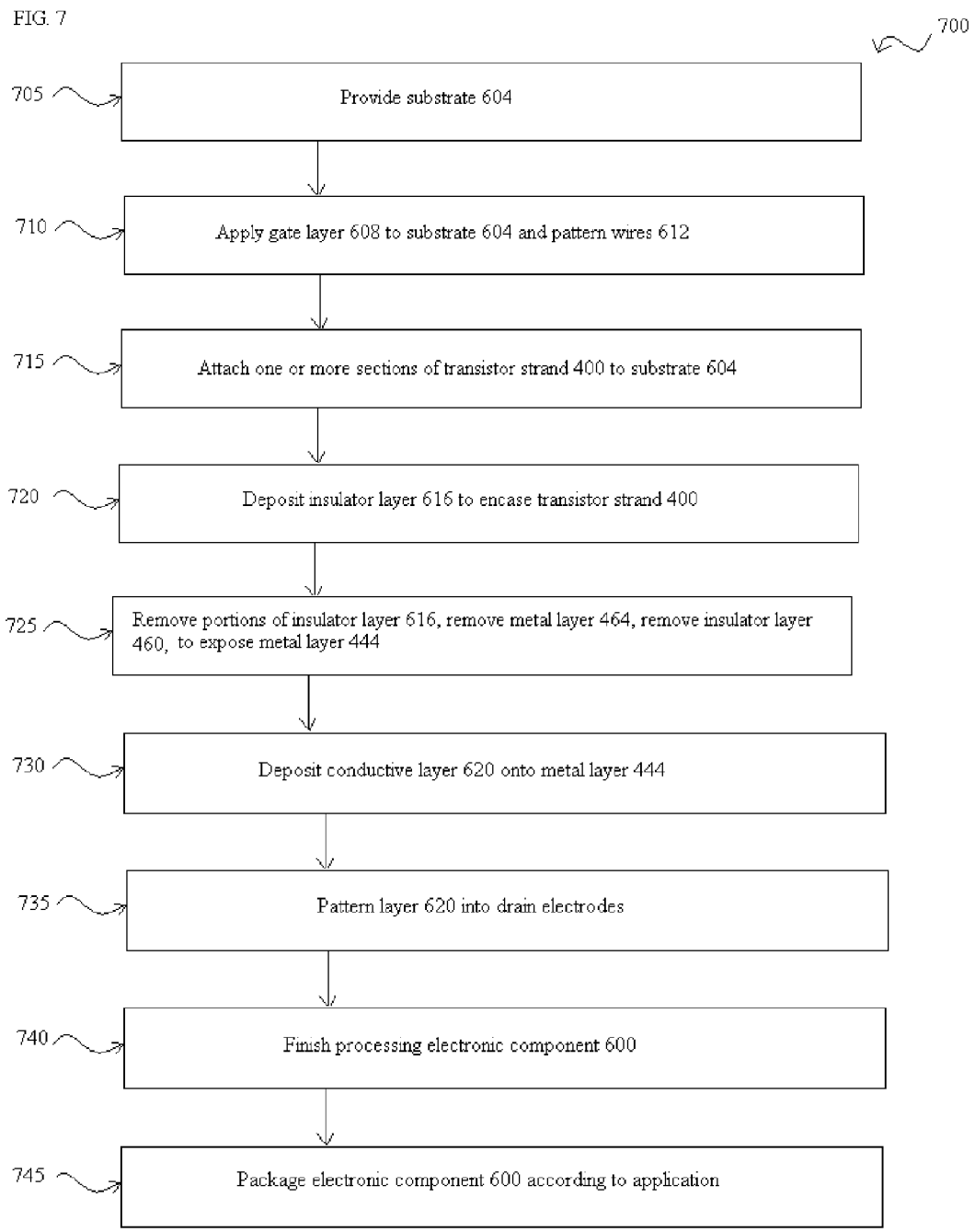

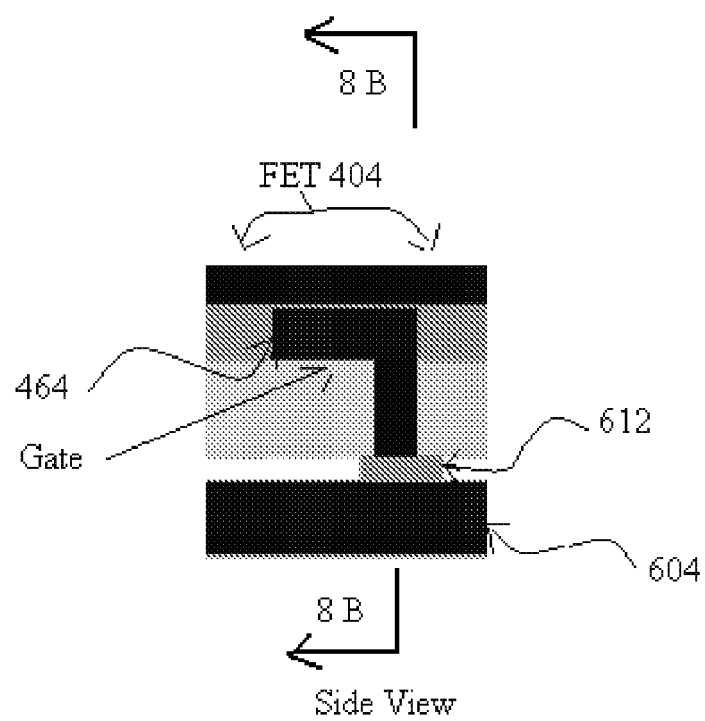

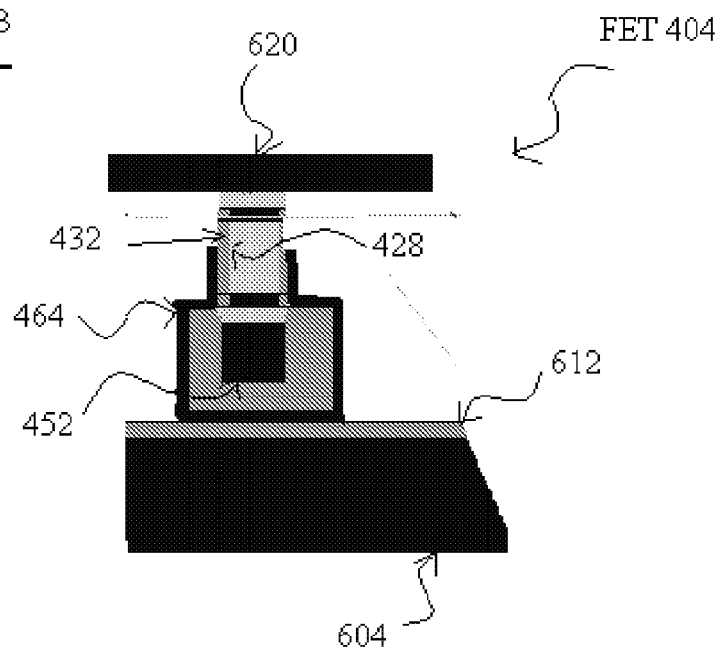
Transverse section
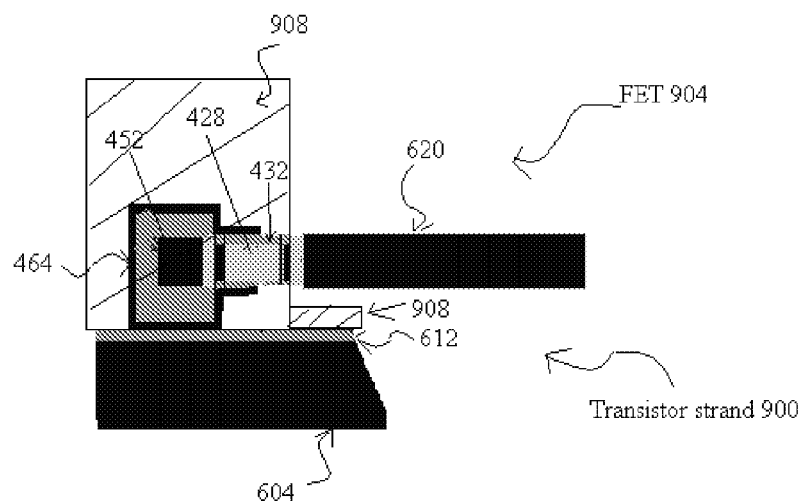
Transverse section

Starting silicon (100) wafer

Etch V grooves on top surface

Etch V grooves on bottom surface and create the "bellows" like structure above

Cut the "V" grooves into silicon structures

Laminate the silicon structures to wires. This can be done before or after dopant implantation and metalization of the silicon structures.

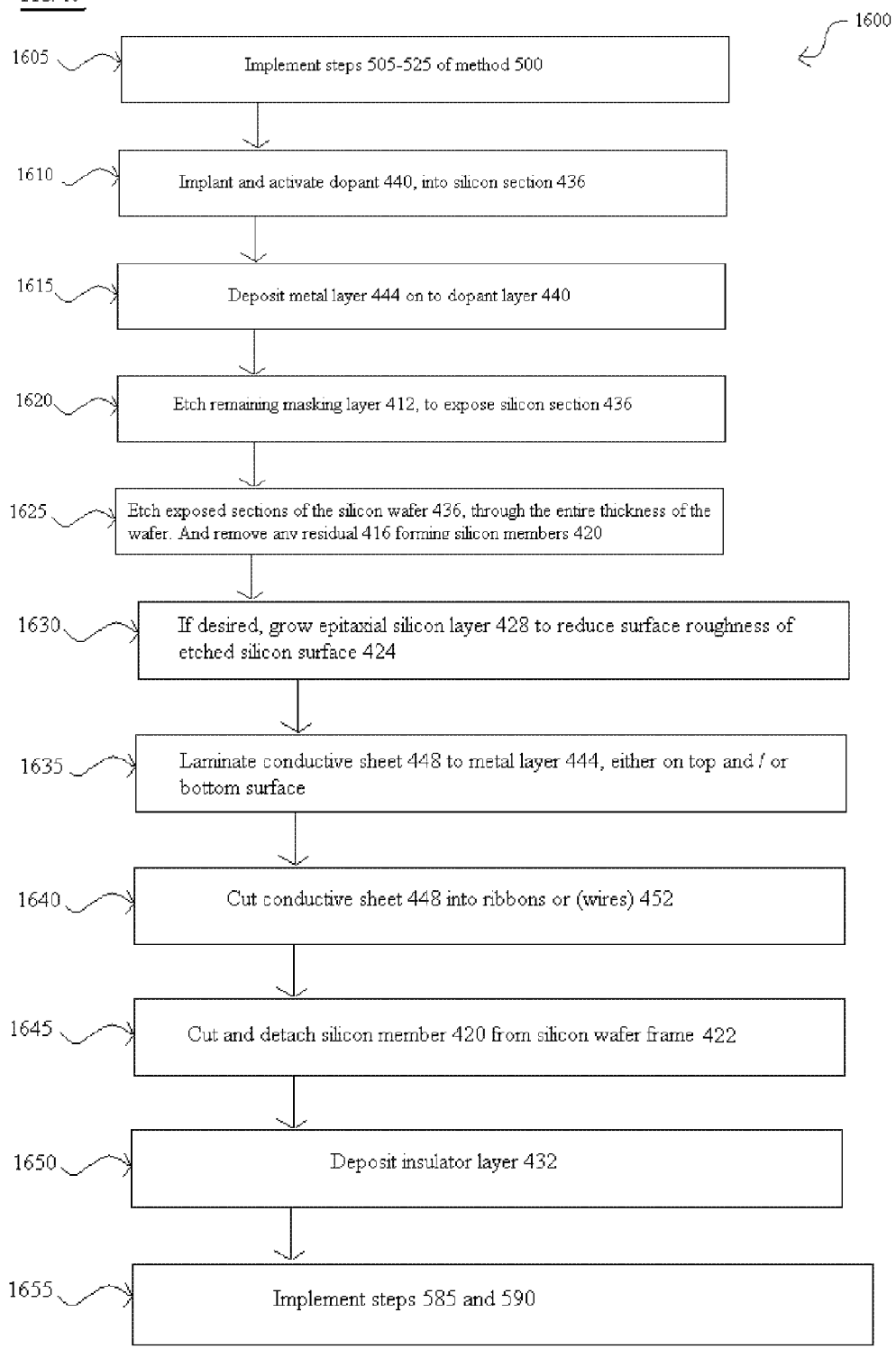

Top View

Top View

Top View

Take up spool          Feed spool

METHODS OF MAKING SEMICONDUCTOR-BASED ELECTRONIC DEVICES ON A WIRE AND ARTICLES THAT CAN BE MADE THEREBY

RELATED APPLICATION DATA

This application is a division of U.S. patent application Ser. No. 11/610,195 filed Dec. 13, 2006, and titled "Method Of Making Semiconductor-Based Electronic Devices On A Wire And By Forming Freestanding Semiconductor Structures And Devices That Can Be Made Thereby," which claims the benefit of priority of U.S. Provisional Patent Application Ser. No. 60/749,491 filed Dec. 13, 2005, and titled "Novel Method Of Making Flexible Electronics," U.S. Provisional Patent Application Ser. No. 60/797,795 filed May 5, 2006, and titled "Novel Manufacturing Method for Field Effect Transistor" and U.S. Provisional Patent Application Ser. No. 60/816,671 filed Jun. 28, 2006, and titled "Method of making Flexible, Transparent Conductive Films." This application also claims the benefit of priority of U.S. Provisional Patent Application Ser. No. 60/797,796 filed May 5, 2006, and titled "Novel Method Of Making Flexible Electronics," U.S. Provisional Patent Application Ser. No. 60/851,619 filed Oct. 16, 2006, and titled "Novel Manufacturing Method for Field Effect Transistor," U.S. Provisional Patent Application Ser. No. 60/851,621 filed Oct. 16, 2006, and titled "Method of Making Flexible Transparent Conductive Films" and U.S. Provisional Patent Application Ser. No. 60/851,431 filed Oct. 16, 2006, and titled "Novel Method Of Making Flexible Electronics." Each and every one of the foregoing applications is incorporated by reference herein in its entirety.

FIELD OF THE INVENTION

The present invention generally relates to the field of semiconductor electronics. In particular, the present invention is directed to methods of making semiconductor-based electronic devices on a wire and articles that can be made thereby.

BACKGROUND

With the continuing evolution of the electronics industry, new techniques are continually needed to allow not only incremental progress, but also (albeit typically less often) major technological leaps that become the impetus for another round of incremental progress. For example, in the manufacturing of displays, for example, flat-panel displays such as video, television and computer monitors, among others, substrate sizes have been increasing incrementally over the approximately seven generations of flat panel display technology. The initial substrate size of the first generation of flat panel displays was roughly 320 mm×400 mm. This has increased to about 1800 mm×2100 mm in the current (seventh) generation of flat panel displays. However, these ever-increasing substrate sizes create significant manufacturing and engineering challenges with regard to their use, handling and transportation. In addition, the upfront capital investment in infrastructure required to process these large sheets of glass for each subsequent generation of fabrication has ballooned to upwards of $2 billion per fabrication facility.

Furthermore, future trends in the display/electronics industry suggest that future display and electronic products will be made on flexible/conformal substrates. This transition is seen as inevitable to service the ever present need and desire to reduce the size, weight and cost of devices we use without sacrificing performance. A wide gamut of devices, such as displays, electronics and sensors, to name a few, would benefit from methodologies that would result in the mass production of ruggedized, light-weight, portable, small-form-factor, less power hungry and lower-cost devices. Moreover, new and novel markets and opportunities could be addressed and opened-up if these devices could be made flexible and/or conformal.

To counter the ever-growing substrate-size dilemma and to service future flexible display needs, attempts have been, and are being, made to develop manufacturing processes that would allow for roll-to-roll, or reel-to-reel (also call "web coaters"), technologies. These technologies would allow flexible substrates, such as polymer/plastic foils and metal foils, to be substituted for rigid glass substrates. However, attempts so far have had limited success, primarily due to the complexity of manufacturing active electronic devices, such as field-effect transistors (FETs) that form the basis of most electronic circuitry (note that thin-film transistors (TFTs) are typically in the form of FETs). Typical manufacturing of such devices requires multiple coatings deposited at high temperatures and interspaced with multiple photolithographic patterning steps.

It is commonly known that polymers/plastics, if used as substrates, severely limit the maximum temperature that may be used during device manufacturing. In addition, to prevent undue out-gassing and contamination of equipment and devices during coating deposition, these substrates need to undergo a complex and time-consuming pre-bake thermal cycling step. This step also serves to expel moisture and humidity from the native polymer substrate, thereby stabilizing the coefficient of thermal expansion of the substrate, which is helpful in the photolithographic patterning and pattern alignment steps. Metal foils are more resilient and tend to be immune from this temperature limit imposed by polymer/plastic substrates. However, to date, TFT devices made on metal foils have exhibited low electronic performance due to contamination effects and "unknowns" attributed to high surface-roughness of starting metal substrates.

In addition, the use of flexible substrates has placed heavy demands on engineering new ways and equipment to address dimensional stability of substrates during lithography, mechanics for handling substrate curvature, registration accuracy and consistency of placement of TFTs and electrodes. Furthermore, flexible polymer/plastic substrates have had issues with moisture absorption and resistance to solvents and other chemicals. One of the more significant of these technical challenges that has slowed, and even stymied, attempts at roll-to-roll manufacturing of electronic devices on either polymer/plastic or metal foils is the issue with photolithographic registration and alignment due to the number of coatings and photomasking steps involved in the manufacturing of traditional TFTs.

Pick-and-place techniques wherein complete and/or partial circuits are manufactured in a silicon (semiconductor) wafer and then transferred onto a separate substrate and interconnected to form electronic articles have been known in the semiconductor industry for some time. A variant of the pick and place method is the "fluidic suspension assembly," or FSA, process, a technique patented by Alien Technology, wherein the manufactured "circuits" are floated into specific locations using a fluidic media and surface chemistry.

Yet another technique, pioneered by Dr. John Rogers and others at the University of Illinois, is a so-called "top down" micro-technology approach to creating high performance active flexible electronic circuits. In short, this group of researchers has created free-standing micro-and nano-scale objects of single crystal silicon (and other semiconductors)

from silicon-on-insulator wafers by lithographic patterning of resist, subsequently etching the exposed top silicon, and removing the underlying $SiO_2$ to lift-off the remaining silicon. The free-standing silicon objects so obtained are then deposited and patterned, by dry transfer printing or solution casting, onto mechanically pliant substrates (like plastic) to yield mechanically flexible thin film transistors. They have coined these objects as "microstructured silicon." Modified versions of the same basic technique are being pursued by Dr. Max Lagally at the University of Wisconsin (SiGe and Strained SiGe crystals), Triton Systems and Si2Technologies, among others.

SUMMARY OF THE DISCLOSURE

In a first embodiment, a method of making an active electronic device strand is provided. The method includes providing a substrate; forming a plurality of elongate members from the substrate, each of the elongate members having a length; and securing a plurality of elongate conductors in a corresponding respective manner to the plurality of elongate members along the length so as to form a plurality of elongate composites each including an elongate conductor and an elongate member.

In a second embodiment, a method of making an electronic component is provided. The method includes making an active electronic device strand in accordance with the first embodiment, the active electronic device strand having a length and comprising a plurality of active electronic devices located along the length, each of the active electronic devices including a source/drain layer and an active channel region comprising a plurality of freestanding semiconductor structures laterally surrounded by a gate layer; providing a substrate; securing the plurality of active electronic devices to the substrate; substantially encasing the plurality of active electronic devices in a first insulator layer; and depositing a source/drain electrode layer over the first insulator layer so that the electrode layer is in electrical communication with each the active channel region.

In a third embodiment, an electronic article is provided. The article includes an electronic component that includes a substrate; a plurality of gate control wires formed on the substrate; and a plurality of active electronic devices, each formed in accordance with the first embodiment, secured to the substrate and in electrical communication with the plurality of gate control wires.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein:

FIGS. 5A-B contain a flow diagram illustrating a method that may be used to make the transistor strand of FIG. 4S;

FIGS. 6B-E are cross-sectional views of the electronic component at various stages of manufacture;

FIG. 7 is a flow diagram illustrating a method of utilizing the transistor strand of FIG. 4S to make the electronic component of FIG. 6E;

FIG. 8A is an idealized side view of one of the transistors of FIG. 4S; FIG. 8B is an idealized transverse cross-sectional view as taken along line 8B-8B of FIG. 8A;

FIG. 9 is an idealized cross-sectional view of a transistor made in accordance with the present disclosure in which the transistor is rotated 90° relative to other embodiments disclosed;

FIG. 16 is a flow diagram illustrating an alternative method of making an AED strand using lower-temperature deposited oxide in lieu of the high-temperature oxidation of the method of FIG. 5;

DETAILED DESCRIPTION

The present disclosure is directed to a method of making electronic devices, such a field-effect transistors (FETs), among others, on a wire, on a wire-like substrate and on other substrates. The method utilizes techniques for forming semiconductor structures that differ from traditional wafer-wide deposit-and-etch techniques used to form more traditional devices, such as CMOS FETs, finFETs, etc. As will be described below in greater detail, the method may be used to create novel electronic device structures, such as flexible electronic structures and novel FET structures that can be used to create any of a variety of electronic articles, for example, displays, lighting, and sensors, among many others, that utilize FETs and other active electronic devices. Important flexible electronic structures that can be made using methods of the present disclosure include "transistor wire," "transistor ribbon," i.e., wire or wire-like bodies (e.g., ribbon), and other active electronic device (AED) strands that contain a plurality of transistors or other active electronic devices along their lengths. Such an AED strand may be used to create any of a variety of flexible, rigid and/or conformal components of electronic articles, ranging from pixel-array components for displays to sensor-array components of large-scale sensors. A fuller description of uses of the methods and structures of the present disclosure appear in U.S. Provisional Patent Application Ser. No. 60/797,795 (hereinafter "the '795 application) and U.S. patent application Ser. No. 11/610,195 (hereinafter "the '195 application") (collectively "the '795 and '195 applications"), which are each incorporated herein by reference in its entirety.

In one embodiment, the present disclosure is directed to a method of making one or more electronic devices on a wire, which includes wire-like structure (ribbon, for example), wherein various layers and other structures are formed on the wire so as to encapsulate the wire. The following examples are primarily directed to the formation of FETs, though those skilled in the art will readily understand how to adapt the techniques disclosed herein to a variety of electronic devices, such as MIM diodes, ring diodes, thick and thin film transistors, CMOS and MOS devices, FETs, MOSFETs, MESFETs, BJTs, IGBTs, and similar devices.

Figure 1:
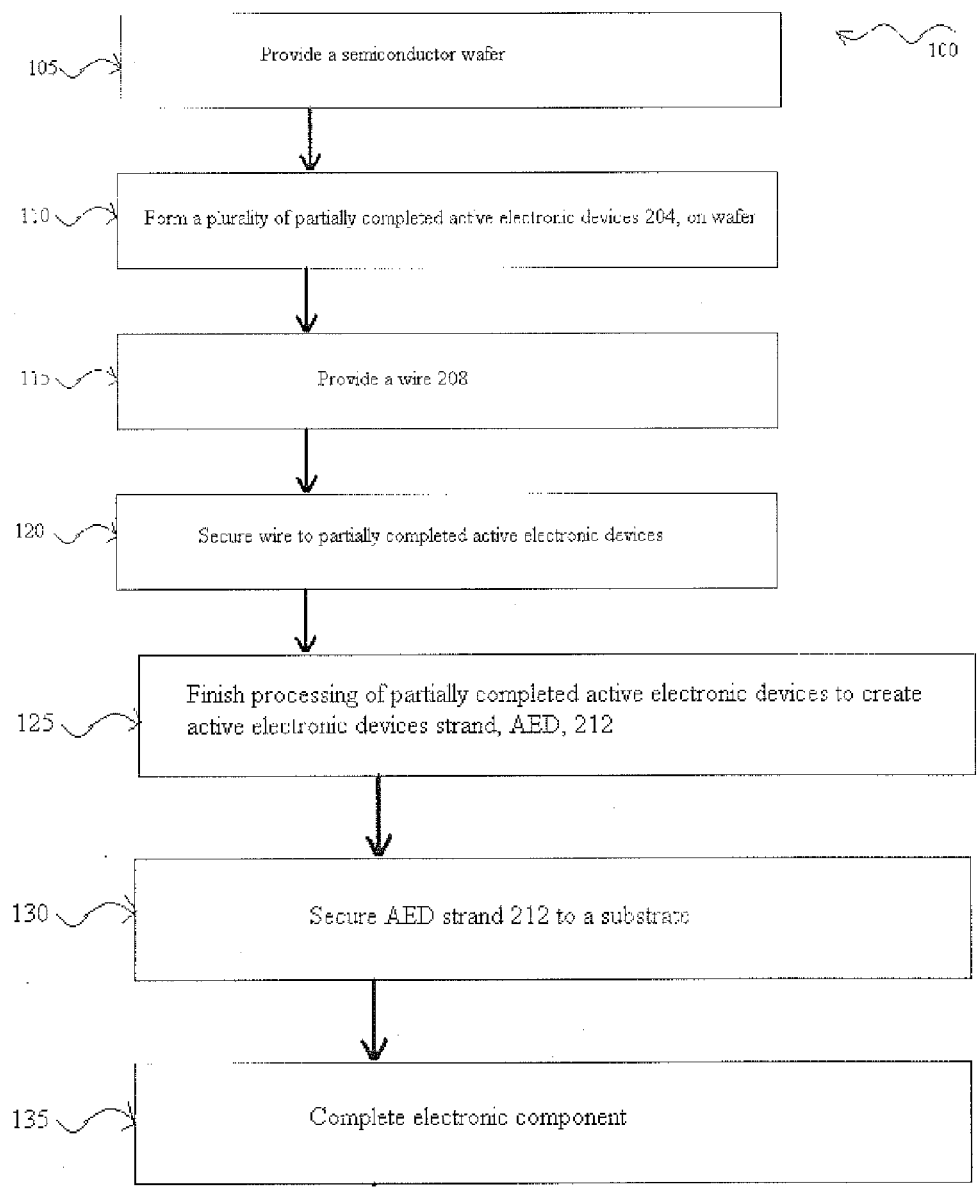
FIG. 1 is a flow diagram illustrating a method of making an electronic component using an active electronic device (AED) strand.

Referring now to FIG. 1, and also to FIGS. 2-3, FIG. 1 contains a high-level flow diagram 100 illustrating the general flow of steps that may be used in forming an electronic component, for example, pixel matrix backplane, emitter array, sensor array, etc., using a transistor strand made in accordance with one or more of the methods described below or contemplated by the broad scope of this disclosure. At step 105, a semiconductor wafer (not shown) having the desired physical shape, surface finish and material composition is provided. Semiconductor materials suitable for use with the wafer are described in more detail in the '795 application. Once the wafer has been provided, at step 110 a plurality of partially completed active electronic devices 204, for example, FETs are formed on the wafer. At step 115, a wire 208 having a desired cross-sectional shape and material composition is provided. Such cross-sectional shapes include simple shapes, for example, round, triangular, rectangular, etc., as well as more complex shapes, such as a dumbbell shape. The composition of wire 208 may be any one of conductive, insulative or semiconductive. Cross-sectional shapes and materials suitable for use with wire 208 selected in step 115 are described in more detail in the '795 and '195 applications. At step 120, wire 208 is secured to partially completed active electronic devices 204.

Once wire 208 is secured, at step 125 additional processing of the plurality of partially completed active electronic devices 204 (FIG. 2), for example, FETs, is done to create an AED strand 212 of such devices. As will be described in greater detail below, various processing techniques are used as needed to build the type of electronic devices 204 and AED strand 212 at issue. Examples of these processing techniques include techniques for reducing the surface roughness of starting wire 208, if needed, techniques for depositing/growing layers (not shown) of various conducting, insulating and semiconducting layers and techniques for patterning and etching such layers. Specific examples of these and other techniques that may be used in forming electronic devices 204 and AED strand 212 are described in more detail in the '795 and '195 applications.

After AED strand 212 has been created, at step 130 AED strand 212 and electronic devices 204 are secured to an appropriate substrate and electrically connected together and/or to other devices (not shown) as needed, as illustrated by connections 304. Electronic devices 204 (and AED strand 212) may be secured to a substrate using any appropriate securing technique. For example, if electronic devices 204 (FIG. 2) are FETs having corresponding respective gate electrodes (not shown), substrate 300 may include patterned wires (not shown) that contacts respective ones of the gate electrodes. In this case, electronic devices 204 may be bonded to the wires using a technique suitable to maintain the electrical continuity between the wire and gate electrode. As described in the '795 and '195 applications, substrate 300 may be either a permanent or temporary substrate selected for the particular electronic component at issue.

There are several ways in which electronic devices 204 and AED strand 212 can be applied to a substrate, such as substrate 300. For example, as shown in FIG. 3, AED strand 212 may be applied to substrate 300 essentially as is, i.e., as a continuous strand, by itself or with other AED strands (not shown). If used by itself, it is noted that AED strand 212 may be folded and/or curved so as to be applied to substrate 300 in a desired continuous pattern, such as a back-and-forth pattern or a rectangular spiral pattern (not shown) that, for example, starts or ends near the periphery of the substrate and ends or starts near the center of the substrate. AED strand 212 may, but need not necessarily, remain continuous in the completed electronic component as shown in FIG. 3. Depending on the requirements for connectivity between/among the various electronic devices 204 and/or other components, connections 304 may be made in any suitable manner, such as by applying one or more patterned conductive layers to substrate 300.

After electronic devices 204 and/or AED strand 212 have been secured to substrate and electrically connected as needed at step 130, at step 135 the electronic component may be completed. Steps for completing the electrical component may include, but are not limited to, any one or more of the following: encasing electronic devices 204 and AED strand 212 in insulation, providing pixel electrodes and other conductive layers/structures, removing substrate 300, if temporary and/or affixing to another substrate, forming other electronic devices as needed to complete the electronic component. More detailed descriptions of these and other processing steps that may be used in completing an electronic component may be found in the '795 and '195 applications.

It is noted that in addition to many embodiments of AED strand 212 being flexible, substrate 300 may be flexible as needed to suit a particular application. This flexibility has many practical implications as it relates, for example, to future flexible display and flexible macro-electronics and to general electronics platforms. For example, flexible electronic components made in accordance with methods of the current disclosure may be made conformal (i.e., able to conform to a curve and remain so curved), flexible (i.e., able to flex under applied force and revert back to its original shape when the applied force is removed), rollable (i.e., able to be rolled around an object, for example, a cylinder, back and forth under applied force) and/or foldable (i.e., able to be folded back and forth along an axis under an applied force). Those skilled in the art will readily appreciate that conformal, flexible, rollable and foldable electronic components can be optimized by orienting the AED strands, for example, AED strands 212 of FIG. 2.

Figure 2:
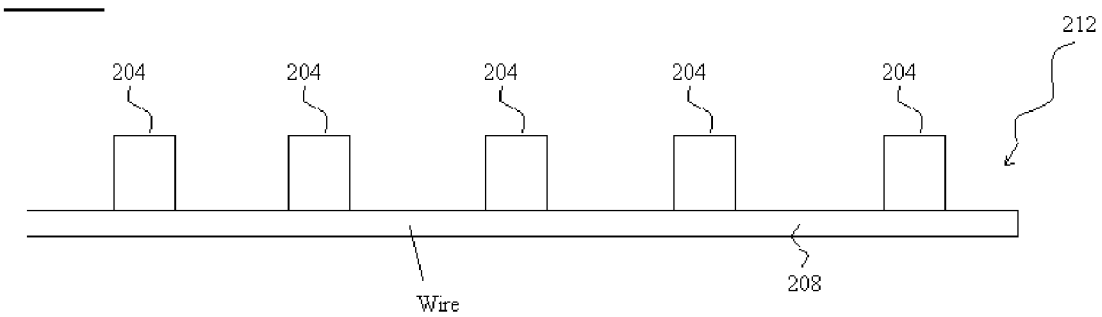
FIG. 2 is a schematic diagram illustrating an AED strand that may be made using methodology of the present disclosure.
Figure 3:
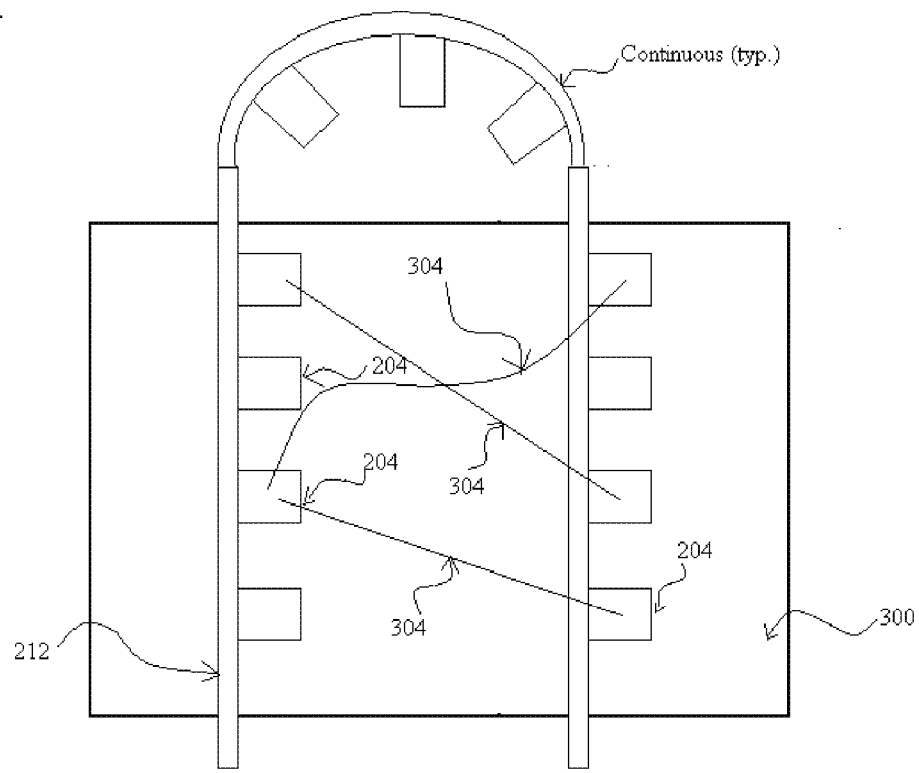
FIG. 3 is a schematic diagram illustrating an electronic component made in accordance with the method of FIG. 1.

As mentioned above, AED strands, such as AED strands 212 of FIG. 2, may be made using a variety of techniques. Examples of these techniques are described immediately below.

In a first example, the electronic devices of an AED strand made in accordance with methods of the present disclosure are FETs that utilize single crystal silicon for the channel regions of the FETs. FIG. 5 illustrates a method 500 of making a transistor strand 400 (FIG. 4S) that includes a plurality of FETs 404 formed on a wire 452.

Figure 4A:
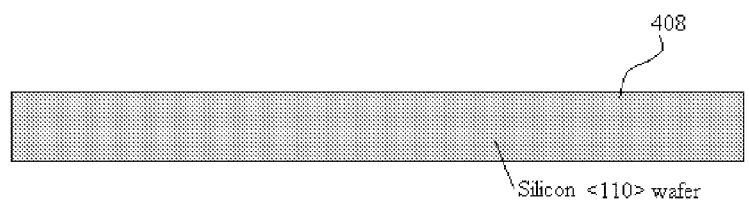
FIGS. 4A-S each show a cross-sectional view (transverse or longitudinal, as appropriate) of a transistor strand at a particular stage of manufacture.
Figure 4B:
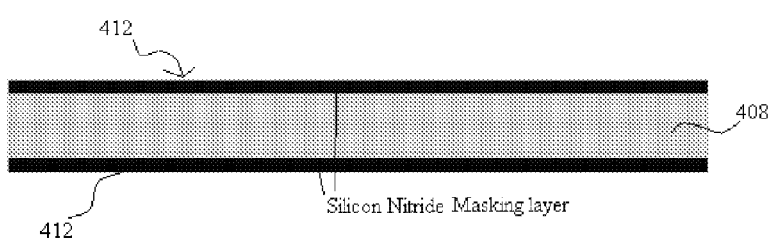
Figure 4C:
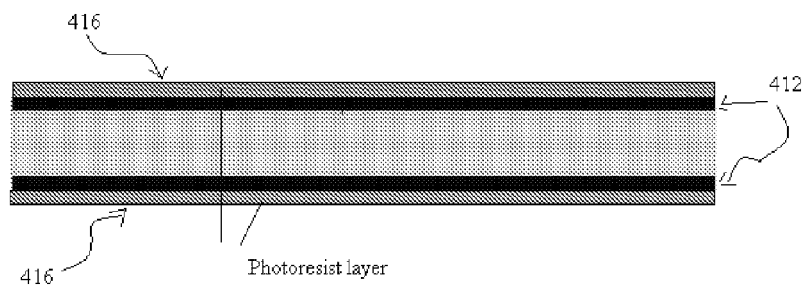
Figure 4D:
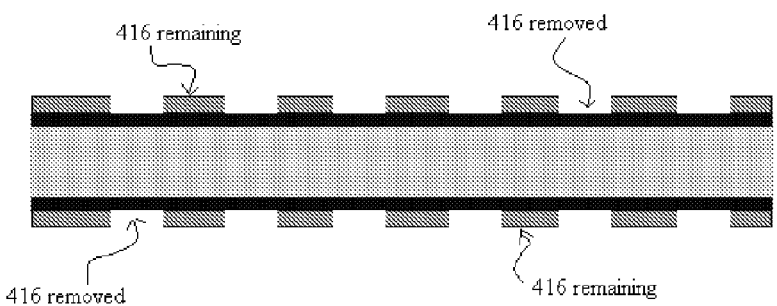
Figure 4E:
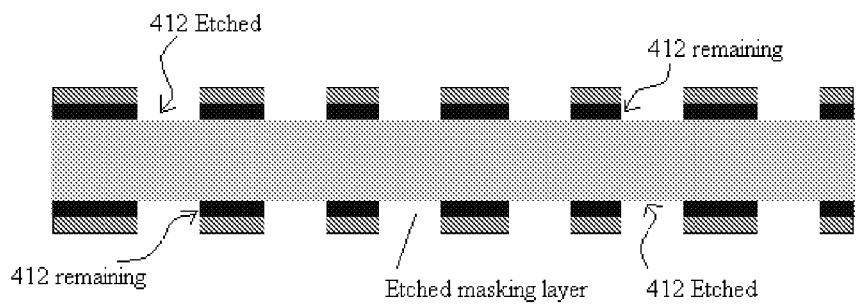
Figure 4F:
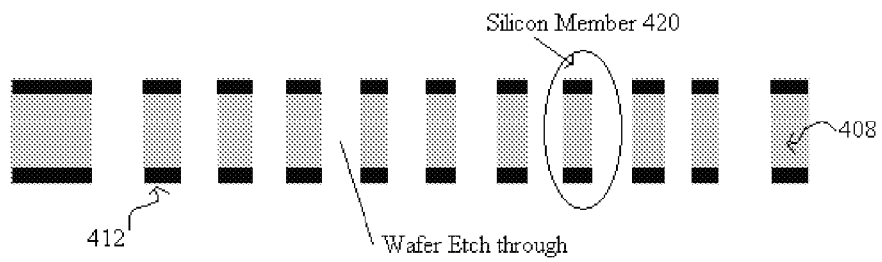
Figure 4G:
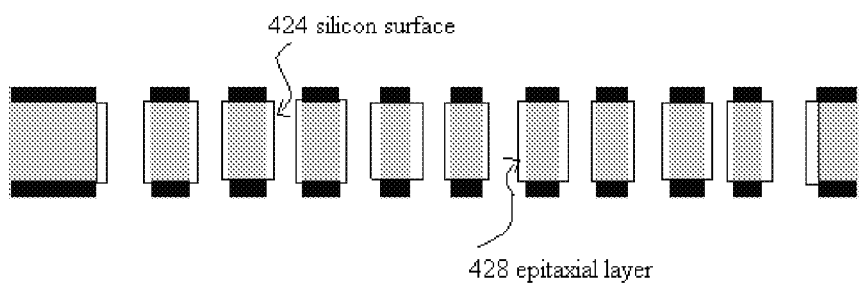
Figure 4H:
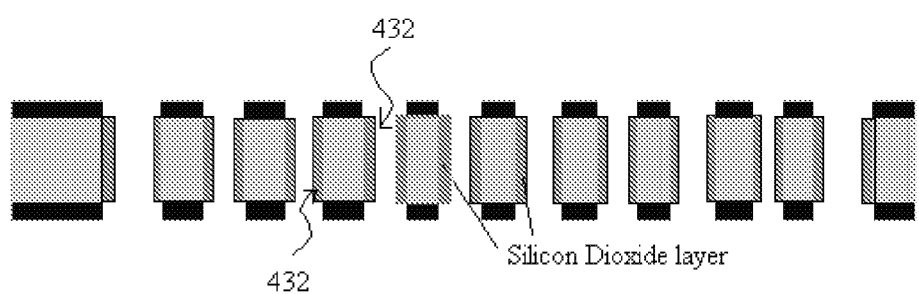
Figure 4I:
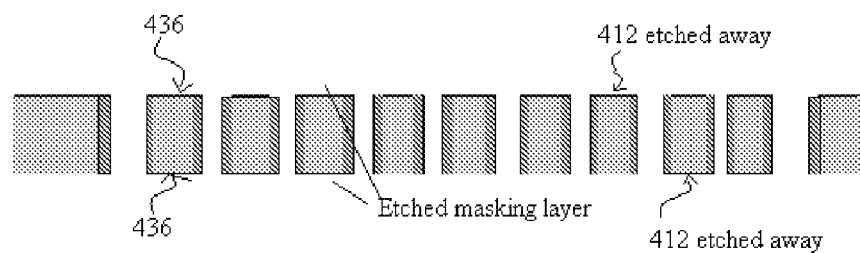
Figure 4J:
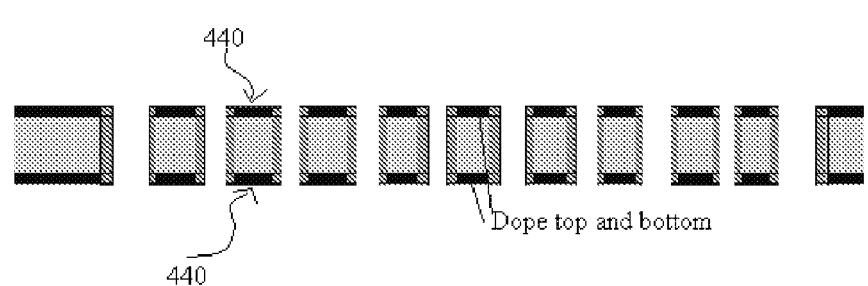
Figure 4K:
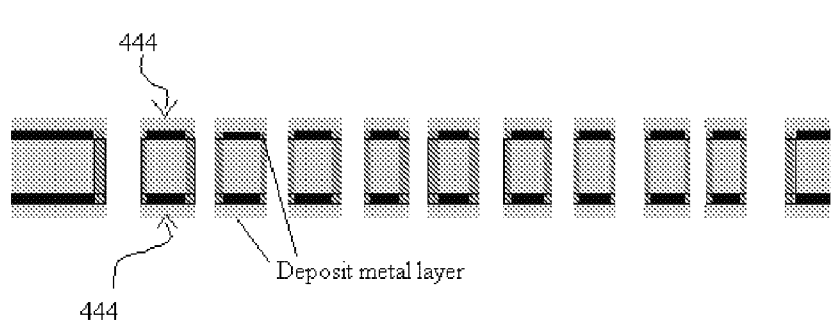
Figure 4N:
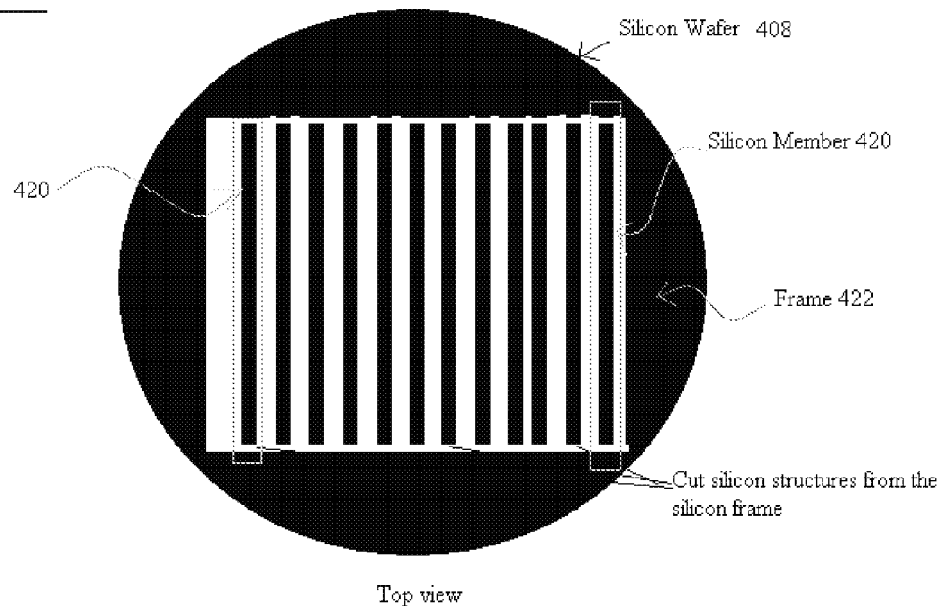
Figure 4O:
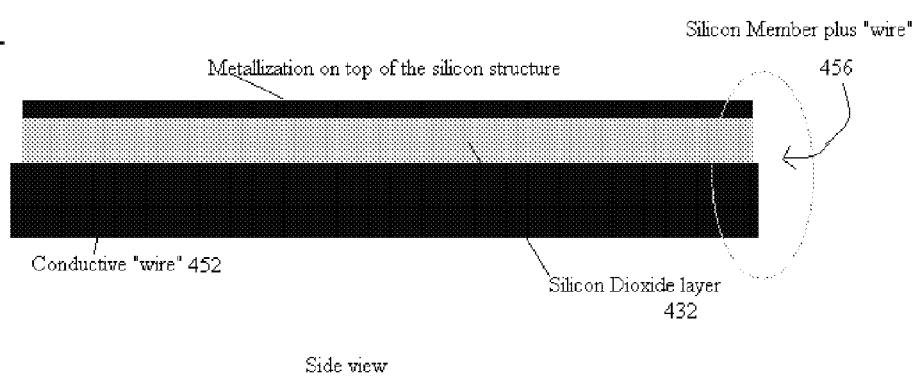
Figure 4P:
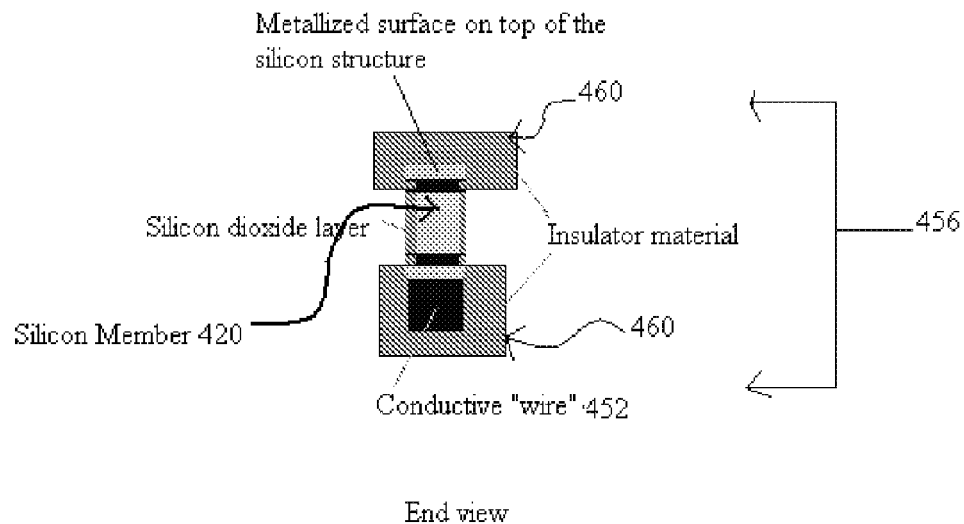
Figure 4Q:
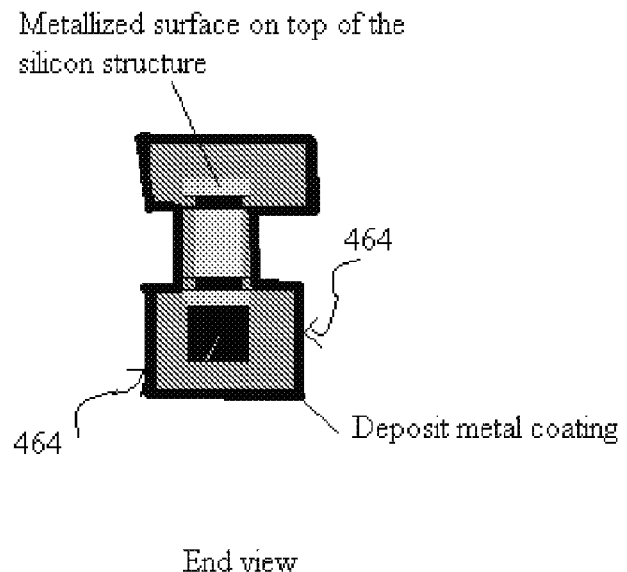
Figure 4R:
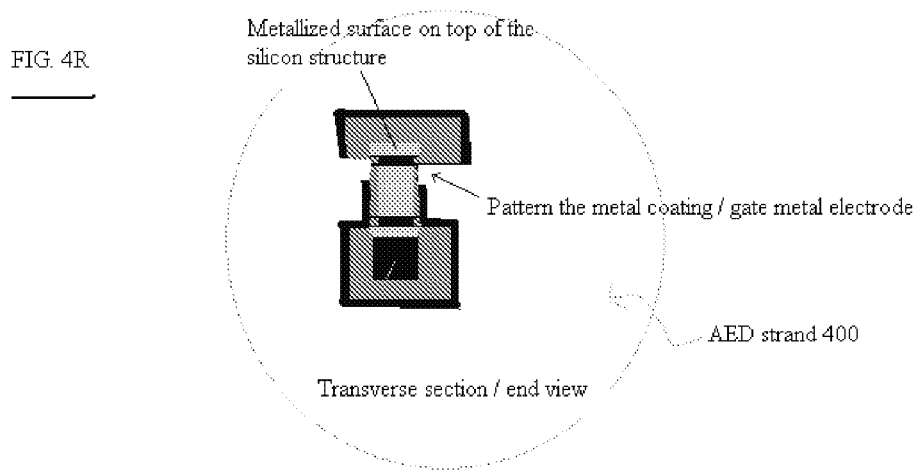
Figure 4S:
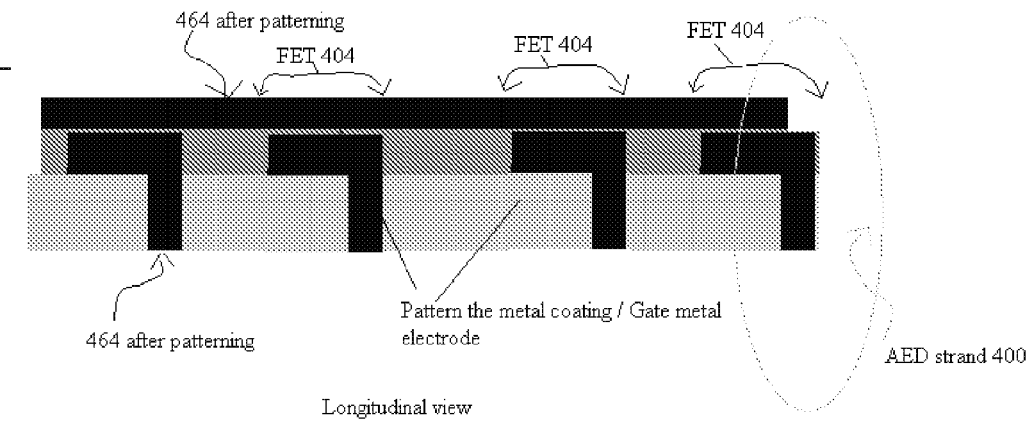

Referring now to FIG. 5, and also to FIGS. 4A-S, at step 505 a single crystal silicon wafer 408 with <110> crystal orientation is provided (FIG. 4A). As discussed above relative to the semiconductor wafer mentioned in the context of flow diagram 100 of FIG. 1, other semiconductor wafer compositions may be utilized. A representative list of such compositions is found on pages 19-20 of the '795 application. In this example, the wafer 408 is ground and polished on both sides and may be doped or undoped. At step 510, masking layers 412 are deposited on both of the top and bottom surfaces of wafer 408 (FIG. 4B). Exemplary masking layer compositions are described in detail on page 20 of the '795 application. Following this at step 515, photoresist layers 416 are deposited on both of the top and bottom surfaces of 408 on top of 412 (FIG. 4C).

At step 520, the photoresist layers 416 are exposed, developed and patterned with the desired pattern (FIG. 4D). In this particular method, as silicon wafer 408 is completely etched through, it would be preferable to have the patterns for the top and bottom surfaces be mutually aligned. Techniques for photoresist patterning, composition and photolithography are detailed on pages 21-25 of the '795 application. At step 525, the exposed sections of the masking layers 412 from step 520 are etched to reveal the underlying silicon surface (FIG. 4E). At step 530, the exposed silicon surface is etched through the entire thickness of the silicon wafer 408 (FIG. 4F) creating silicon members 420 and a "frame" 422 (FIG. 4N) that supports the silicon members during at least some of the subsequent processing steps. (It is noted that the unfilled ovals appearing in FIG. 4F (and in FIGS. 4M, 4O, 4R, 4S, 6B, 11A, 12E, 12F, 14, 15A, 15B, 15C and 18A) are abstractions indicating the presence of a strand of partially or fully completed active electronic devices. As those skilled in the art will appreciate, the shape of each such oval generally indicates the direction of the longitudinal axis of that strand.) Furthermore, any remaining photoresist 416 is now removed. Various etching techniques that may be utilized are outlined on pages 25-26 of the '795 application. It is noted that the etching may be wet or dry and the sidewalls of the silicon members 420 may be substantially vertical, however, in the general case they may have any angle between 90° and about 40° from horizontal. It is also noted that while silicon members 420 are defined in this example by double-sided etching, those skilled in the art will recognize that the individual silicon members may be defined by single-sided etching and other material removal techniques, such as cutting, ablation, etc.

FIG. 4A illustrates a starting substrate 408 in the foregoing embodiment as a <110> orientation silicon wafer. However, the starting substrate 408 could be of any other orientation, for example: <100> orientation, <111> orientation, etc. It is well known that DRIE (deep reactive ion etching) can be used to create deeply etched patterned silicon members 420, as desired. Alternatively, silicon members 420 with vertical sidewalls (or nearly vertical sidewalls) can be obtained using (100) wafers and wet anisotropic etching, when the mask pattern in step 520 is aligned 45 degrees from the primary flat.

Depending on the surface quality of the etched silicon surfaces, at step 535 an epitaxial layer of silicon 428 may be deposited on the etched silicon surfaces 424 (FIG. 4G) to reduce its surface roughness, if so desired. At step 540, an insulator layer of silicon dioxide 432 (FIG. 4H) is grown on silicon layer 428, if present, or on silicon surfaces 424. The silicon dioxide layer 432 may be grown by wet or dry thermal oxidation and will form the gate insulator in the finished FETs 404 (FIG. 4S). Alternatively, other insulator layers may be preferentially deposited on silicon surface 424 or silicon layer 428. Material compositions for such alternative insulators is detailed on pages 26-28 of the '795 application.

At step 545, the remaining masking layer 412 on the top and bottom surfaces of silicon wafer 408 is etched away exposing silicon wafer sections 436 (FIG. 4I). At step 550, active dopants 440 (FIG. 4J) are implanted and activated into the silicon wafer sections 436 from step 545 above. These dopants 440 will form the ohmic contact to the source/drain electrode in the finished FETs 404 (FIG. 4S). Typical dopants and their deposition techniques have been elaborated on pages 19-20 of the '795 application.

At step 555, metal layer 444 (FIG. 4K) is deposited on the top and bottom surfaces of the silicon wafer sections 436 over the dopant layer 440. One side of metal layer 444 will get attached to the source/data bus line, whereas the other side will end up electrically connected to the drain electrode of the finished FETs 404 (FIG. 4S). Material compositions for representative metal layers are detailed on page 21 of the '795 application.

At step 560, a conductive sheet (or foil) 448 is laminated (bonded) to the top and/or the bottom (FIG. 4L, 4L') surfaces of the metallized coating layer 444 on substrate 408. Exemplary compositions for the conductive sheet (or foil), bonding techniques, are revealed on pages 28-32 of the '795 application. At step 565, the conductive sheet 448 is cut into wires (or ribbons) 452 (FIG. 4M). Each wire 452 is thereby comprised of its own silicon member 420. Conductive wire 452 will serve the function of the source electrode/data bus line of the finished FETs 404 (FIG. 4S). Some techniques for cutting the conductive sheet into wires (or ribbons) are detailed on page 33-34 of the '795 application.

At step 570, silicon member 420 is cut (detached) from the silicon frame 422 (FIG. 4N). A side view of the composite 456 of silicon member (not shown but located beneath silicon dioxide layer 432) plus wire 452 is depicted in FIG. 4O. Typical semiconductor wafers are of finite diameters, typically less than 12 inches. However, in applications wherein longer FETs arrays may be required, such as large-area displays, an optional step 575 may be introduced, wherein step 505 thru step 570 may be repeated multiple times along the length of a large substrate, so as to create long, continuous or substantially continuous silicon member "wires."

At step 580, an insulator layer 460 (FIG. 4P) is deposited on composite 456. Insulator layer 460 is deposited selectively, such that the insulator layer only covers the metallic wire 452 (source electrode) and the free metallized end of silicon member 420. For example, selective deposition techniques such as electro-deposition, electro-plating, and electrophoretic may be utilized. Exemplary material compositions for insulator coatings for forming insulator layer 460 are detailed on pages 26-28 of the '795 application. At step 585, a metal layer 464 (FIG. 4Q) is conformally deposited on composite 456. Metal layer 464 will form the gate metal layer of the finished FET devices 404 of FIG. 4S.

At step 590, metal layer 464 is patterned as desired. FIG. 4R and FIG. 4S are transverse and longitudinal views of such patterning respectively. At this point, AED strand 400 may be considered finished and ready for use in creating an electrical component, for example, as described below in connection with FIGS. 6A-E and 7.

Figure 6A:
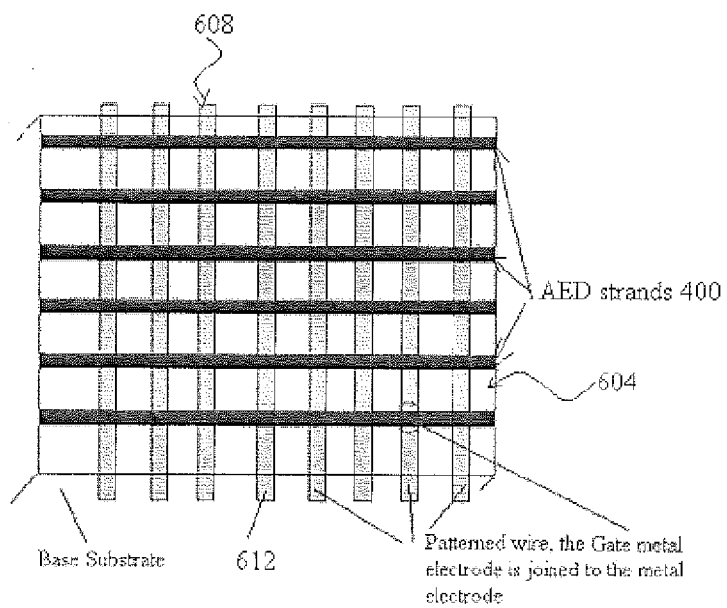
FIG. 6A is a plan view of a substrate for making an electronic component (FIG. 6E) that utilizes the transistor strand of FIG. 4S.

Referring now to FIGS. 6A-E, and also to FIG. 7, FIG. 6E shows a partially finished electronic component 600 made, for example, by affixing one or more transistor strands 400 of FIG. 4S to a substrate 604. Substrate 604 may be, for example, any suitable one of the substrates described on pages 35-38 of the '795 application. FIG. 7 illustrates a method 700 that may be used to form electronic component 600 of FIG. 6E. Referring to FIG. 6A, at step 705, substrate 604 is provided. At step 710, a gate layer 608 comprising a series of patterned conductive wires 612 is applied to substrate 604. Wires 612 may, but need not necessarily, be parallel to one another and extend in the same direction, which may be orthogonal to the direction of the longitudinal axes of transistor strand(s) 400 (FIGS. 6B-E) to be attached to substrate 604. The spacing between adjacent ones of wires 612 is as needed to suit a particular application. Wires 612 may be formed of any suitable conductive material, for example, the metals listed on page 21 of the '795 application and may be patterned, like any of the layers of transistor strand(s) 400, using, for example, any suitable one(s) of the patterning and etching techniques described on pages 21-25 of the '795 application.

Figure 6B:
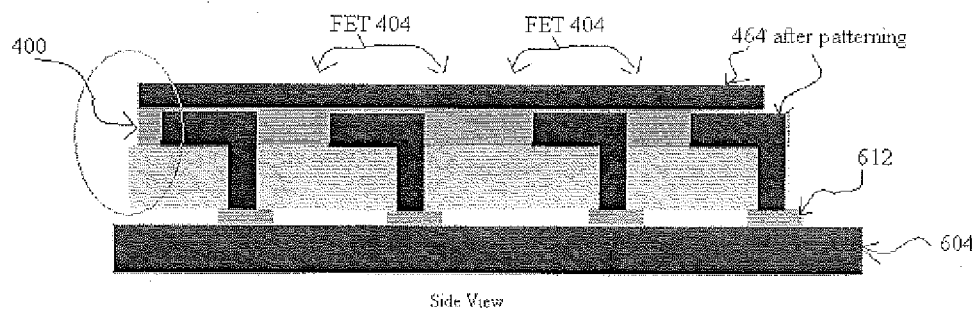
Figure 6C:
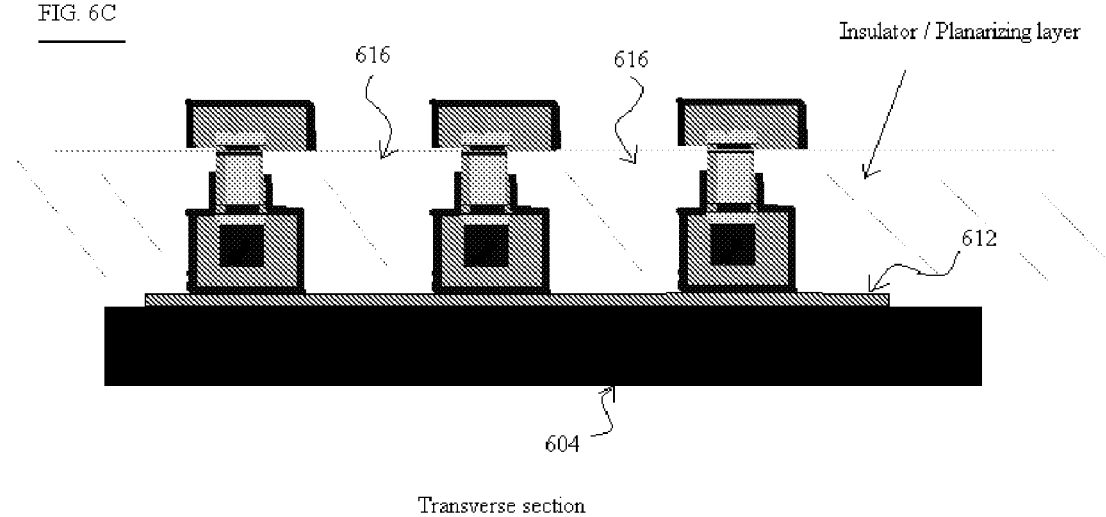

At step 715, one or more sections of transistor strand 400 or one or more entire strands are attached to substrate 604 as illustrated in FIG. 6B so that the patterned wires 612 are in electrical contact with patterned conductive layers 464 of the various FETs 404 on the transistor strand. It is noted that transistor strand 400 may be cut to the appropriate length after or before being affixed to substrate 604. Bonding of conductive layers 464 to patterned wires 612 of substrate 604 may be accomplished using any suitable technique, such as any of the techniques listed on page 32 of the '795 application. After bonding, at step 720 an insulating layer 616 (FIG. 6C) may be deposited to encase transistor strands 400, or portions thereof, and fill the space between the strands/portions. The material of insulating layer 616 may be organic or inorganic in composition and may be photosensitive, if desired. Insulating layer 616 may also serve to planarize the free surface of the assembly. Representative planarization layer material compositions are detailed on page 34 of the '795 application.

Figure 6D:
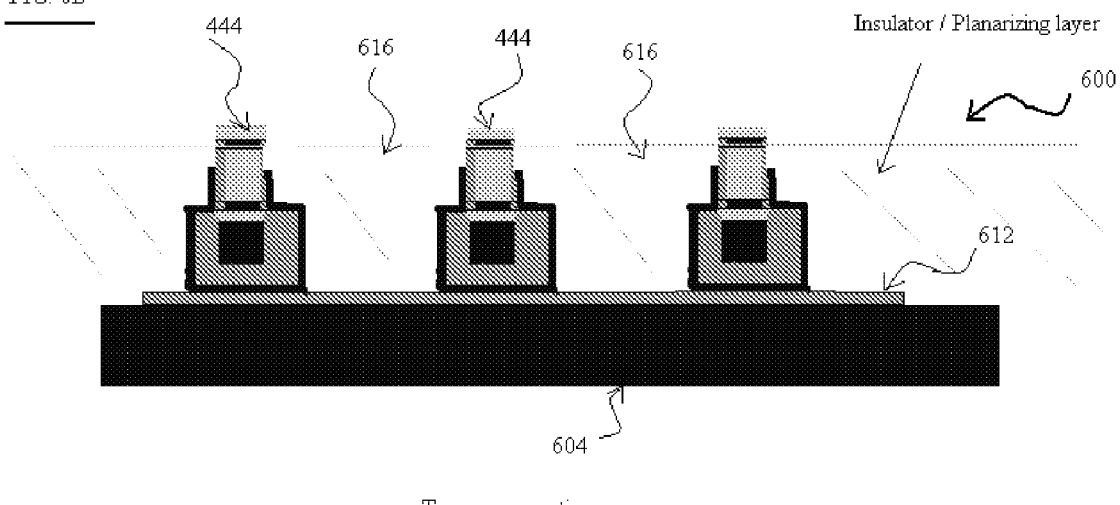

After depositing insulating layer 616, at step 725 a portion of this insulating layer is etched or otherwise removed to reveal metal layer 464, which is also etched or otherwise removed to reveal insulator layer 460 that, in turn, is etched away or removed to reveal metal layer 444 of transistor strands 400. FIG. 6D illustrates electronic component 600 after the material etching/removal of step 725. At step 730, a conductive layer 620 (FIG. 6E) is deposited on the exposed metal layer 444 using any of a number of deposition techniques, such as techniques describe in the '795 application. Conductive layer 620 will provide FETs 404 with drain electrodes after patterning in step 735. At step 740, electronic component 600 may be processed further to include any additional devices and structures (not shown) needed, for example, capacitors, resistors, metal interconnects, etc. Then, at step 745, the finished electronic component 600 may be packaged with other components, for example, a driver to drive the back plane of a display, display front panels, such as organic LEDs, liquid crystals, etc., as dictated by the application at hand.

To help visualize the functional structure of FETs 404 on transistor strand 400, FIGS. 8A-B show an idealistic representation of any one of these FETs in the context of electronic component 600 of FIG. 6E. As seen in FIG. 8B, conductive wire 452 functions as the source of FET 404, and conductive layer 620 (e.g., a pixel electrode) of electronic component 600 functions as the drain of the FET. Silicon semiconductor surface 428 function(s) as the channel of FET 404 between the source and drain. Insulator layer 432 atop silicon surface 428 (i.e., the channel) function to insulate the channel from the gate electrode of FET 404, which is provided by patterned conductive layer 464. As is readily seen in FIG. 8B, wire 612 on substrate 604 is in electrical communication with the gate electrode for controlling the gating of the channel (i.e., silicon layer). Some of the more salient features of the foregoing methodologies are described on page 66 of the '795 application.

In the foregoing embodiment, specific examples of process methodologies have been shown. However, as has been fairly extensively catalogued on pages 49-65 in the '795 application, there are a variety of permutations and combinations that may be substituted to create the same net effect. Once familiar with the basic teachings of the present disclosure, those skilled in the art will readily appreciate how to embody and execute these permutations and combinations to achieve desired results.

In the embodiment discussed above, the drain/pixel electrodes (i.e., conductive layer 620) are on the upper surface (relative to the figure FIG. 8B). However, in alternative embodiments the transistor strands can be effectively rotated 90° relative to the substrates so that the drain/pixel electrodes, the source/data bus lines and the gate/gate bus lines can be nearly co-planar. This would make the FETs look more like thin-film transistors in conventional arrays. FIG. 9 shows an idealistic representation of a transistor strand 900 having an FET 904 made in accordance with the broad concepts of method 700, but with some differing steps. One way to achieve the structure shown in FIG. 9 is to modify the steps of method 700 of FIG. 7 as follows. At a step corresponding to step 715, transistor strand 400 is oriented so that silicon member 420 extends sideways and secured to gate bus line 612 on substrate 604 using any of a number of metal joining techniques. As before, gate bus line 612 is one of a plurality of parallel lines patterned on substrate 604. At a step corresponding to step 720, insulator structures 908 may be formed by depositing an insulator layer so as to preferentially encase transistor strand 900 and gate bus line 612. The insulator material for this step may be organic or inorganic in composition. In addition, it may be photosensitive, if desired. This layer can also serve to planarize the top surface. After forming insulator structures 908, steps equivalent to steps 725 onward may be performed to complete a corresponding electronic component.

Figure 10:
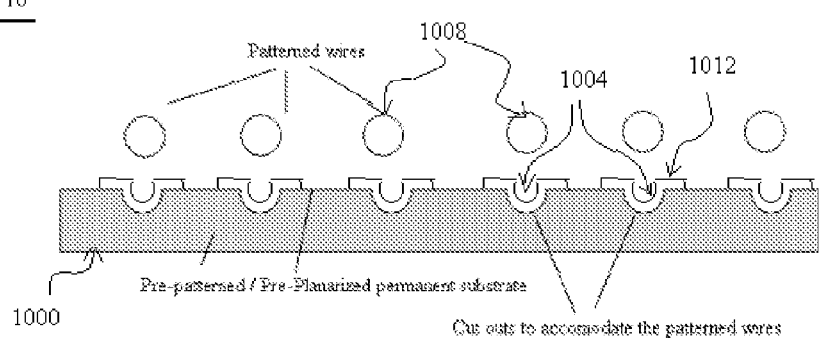
FIG. 10 is an elevational cross-sectional view of a pre-grooved substrate suitable for use with any of a number of the electronic device strands of the present disclosure.

In the preceding examples, substrates 300, 604 (FIGS. 3 and 6A-E) illustrated are shown having substantially flat upper surfaces that confront the corresponding respective AED strands 212, 400. However, and referring to FIG. 10, each of these substrates 300, 604 may be replaced by, for example, a substrate 1000 that includes one or more grooves 1004 or other depressions for receiving AED strands 1008 or portions thereof to aid in arranging the AED strands, or electronic devices thereon, on the substrate relative to one another and/or to other devices. If AED strands 1008 are of the type having a conductive outer layer (not shown), such as for the gate electrodes, and substrate 1000 is provided with grooves 1004 rather than dimples or other depressions, the substrate may be provided with gate bus lines 1012 that, at least locally, have current flow axes that extend perpendicular to the longitudinal axes of grooves 1004. Those skilled in the art will appreciate the variety of substrates and depressions that may be used to aid in aligning AED strands and/or their component electronic devices, for example, FETs.

Referring back to FIG. 8B, this figure illustrates a FET 404 applied to a substrate 604 so that the silicon semiconductor members 420 are oriented vertically relative to FIG. 8B. In that example, conductive layer 464, i.e., gate electrode, extends largely around the circumference of FET 404 from a gate bus wire 612 on substrate. It is noted that the gate electrode need not be arranged in this manner. Rather, the gate electrode may be provided after the transistor strand is applied to a substrate.

Figure 11A:
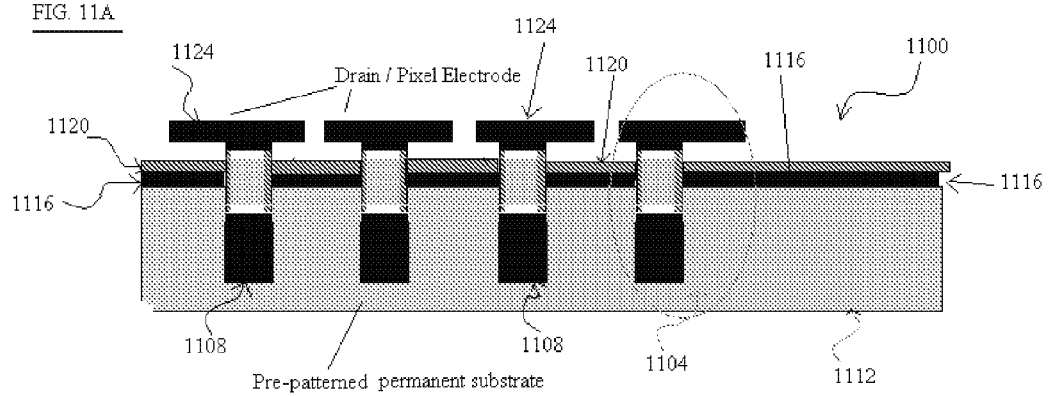
FIG. 11A is an elevational cross-sectional view of an alternative electronic component that includes transistors having their gate electrodes formed after the transistor strands have been attached to a substrate.
Figure 11B:
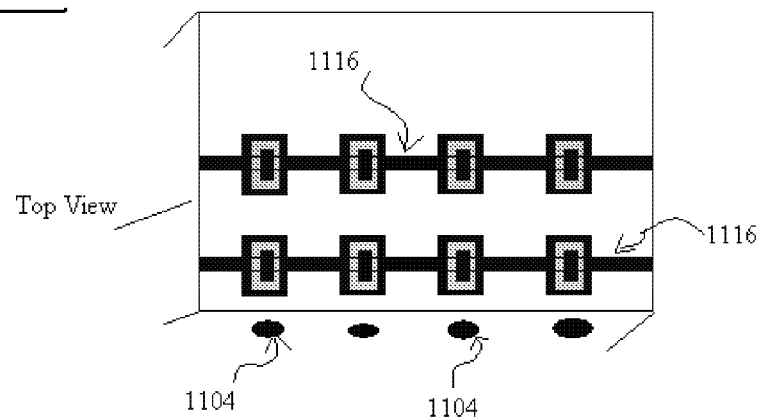
FIG. 11B is a reduced plan/perspective view of the electronic component of FIG. 11A.

For example, FIG. 11A shows a partially completed electronic component 1100 having four identical transistor strands 1104 comprising corresponding respective FETs 1108. As discussed above, a gate electrode layer, for example, conductive layer 464 of FIG. 4Q, is provided to transistor strand 400 (FIG. 4S) before the strand is attached to a substrate. However, in FIG. 11, transistor strands 1104 are embedded in a composite substrate 1112 prior to any gate electrode layer being applied thereto. After transistor strands 1104 have been embedded in composite substrate 1112, a gate electrode layer 1116 is deposited on the substrate and patterned, for example, as shown in FIG. 11B. Then, an insulating layer 1120 (FIG. 11A) is deposited and patterned on gate electrode layer 1116. After insulating layer 1120 has been provided, drain/pixel electrode layer 1124 may be deposited and patterned. Insulating layer 1120, provides electrical insulation between gate electrode layer 1116 and drain/pixel electrode layer 1124 so as to inhibit shorting therebetween.

Figure 12A:
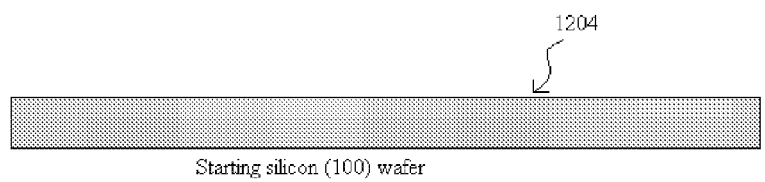
FIGS. 12A-F are cross-sectional views of semiconductor-member-on-a-wire composites (FIGS. 12E-F) at various stages of manufacture.
Figure 12B:
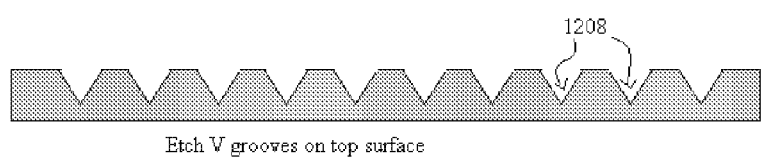
Figure 12C:
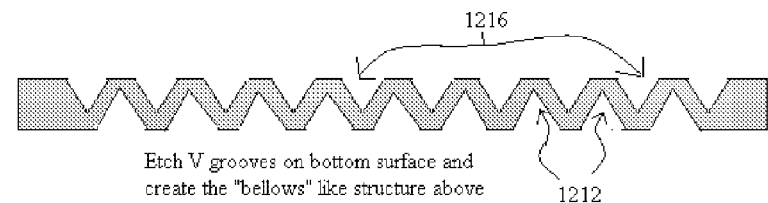
Figure 12:
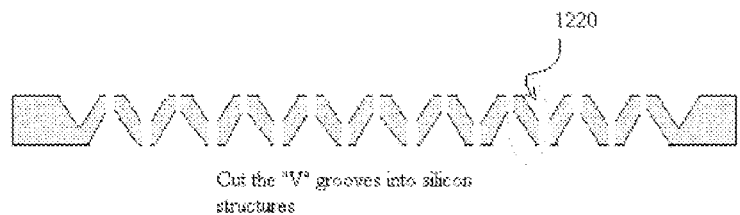
Figure 12E:
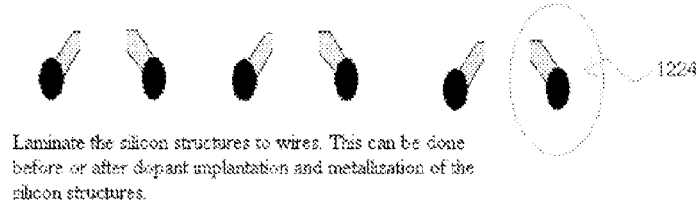
Figure 12:
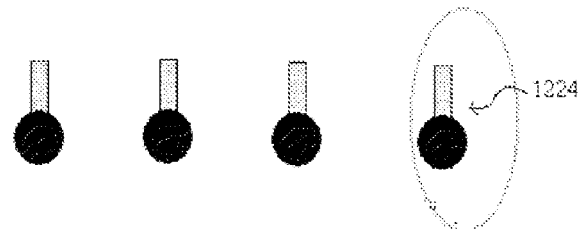

Yet another example is depicted in FIGS. 12A-E. Referring to FIG. 12A, a standard <100> orientation silicon wafer 1204 is provided. Staggered "V grooves" 1208 are then etched into the top of the wafer 1204 (FIG. 12B). Furthermore, another set of staggered "V grooves" 1212 are etched into the bottom of the wafer 1204 (FIG. 12C). The patterns for "V grooves" 1208 and 1212 are aligned so as to yield a series of parallel structures 1216, termed "bellows," as shown in FIG. 12C. As depicted in FIG. 12D, walls of the "bellows" 1216 are etched to yield silicon members 1220. Note how members 1220 are similar to the silicon members 420. Silicon members 1220 are further bonded to wires as shown in FIG. 12E to yield composite structures 1224. As seen more distinctly in FIG. 12F, the resulting composite structures 1224 are similar to composite structures 456 of FIGS. 4O-P.

Figure 13:
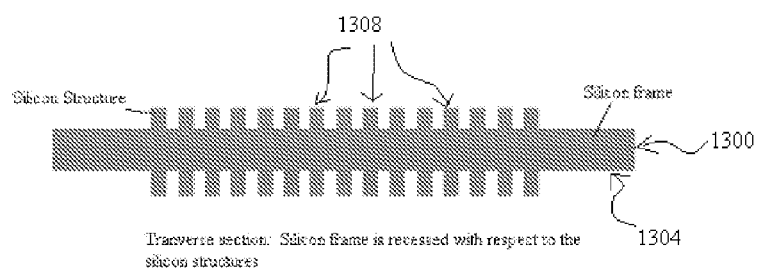
FIG. 13 is a cross-sectional view of a precursor structure that includes a plurality of outwardly extending semiconductor members supported by a recessed wafer frame.

FIGS. 4L and 4L' depict the lamination of a conductive sheet 448 to metal layer 444 on top of silicon wafer 408, which in this example, as will be recalled from FIG. 4N, has a frame 422 that supports the individual silicon members 420 at their respective ends. Subsequently the conductive sheet 448 is cut into wires 452, and the silicon members 420 are detached from the silicon wafer frame 422. In that example, the silicon members 420 are all in the plane of silicon wafer frame 422. FIG. 13, on the other hand, illustrates an alternative precursor structure 1300 formed from silicon wafer in which a frame 1304, which corresponds to frame 422 of FIG. 4N, is recessed in height with respect to the silicon members 1308, which correspond to silicon members 420 of FIG. 4N. This profile of frame 1304 can ease alignment and bonding constraints when additional silicon members 1308 are butted adjacent to previously bonded silicon members as called out by step 575 of method 500. Thus, precursor structure 1300 can readily be used in roll-to-roll or other type of continuous processing methods.

Figure 14:
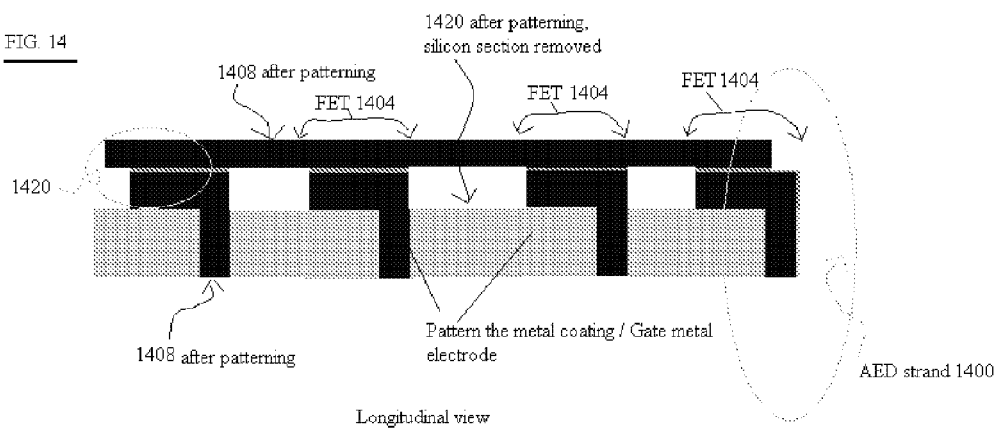
FIG. 14 is a longitudinal cross-sectional view of an alternative AED strand made in accordance with the present disclosure.

Referring again to FIG. 4S, this figure depicts a longitudinal view of AED strand 400, which comprises a plurality of FET elements 404. The underlying silicon member 420 (not shown in FIG. 4S, but shown in FIG. 4O, for example) is substantially continuous in that embodiment. FIG. 14 depicts a longitudinal view of an alternative AED strand 1400, which includes a plurality of FET elements 1404. In this case, silicon member 1420 is patterned along with the gate metal layer 1408 to reduce the overlap between the source/drain and gate layers, thereby reducing circuit capacitance and also in making AED strand 1400 more flexible.

Figure 15A:
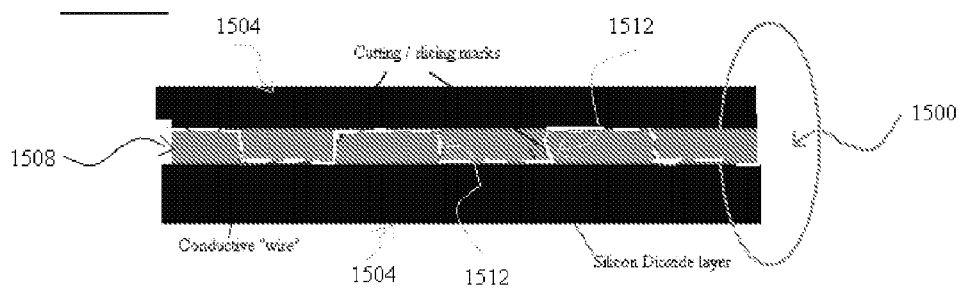
FIGS. 15A-C are cross-sectional views illustrating an alternative method of manufacturing AED strands that increases yields.
Figure 15B:
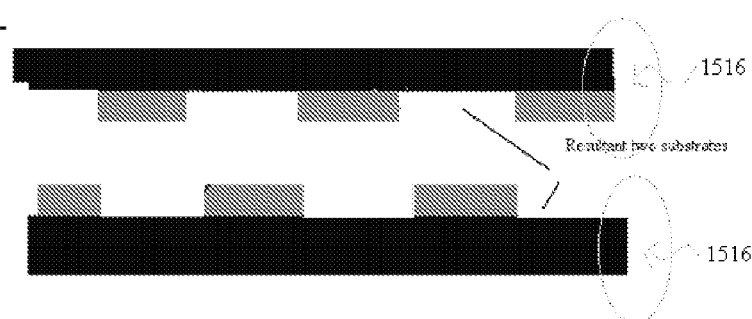
Figure 15C:
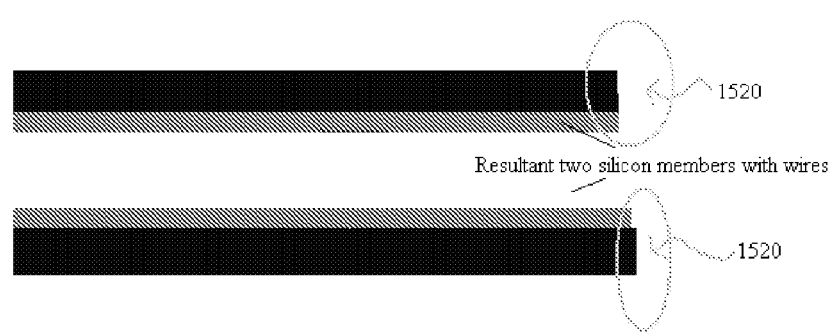

Referring to FIG. 4O, this figure shows a longitudinal view of silicon-member-plus-wire composite 456. Underlying silicon member 420 is substantially continuous in the embodiment of FIG. 4O and, furthermore, the thickness of the silicon member is dictated by the thickness of the starting silicon wafer 408. In some applications, it can be advantageous to increase the number of FET elements 404 (FIG. 4S) that can be realized from one starting wafer 408 (FIG. 4A). Referring now to FIG. 15A-C, FIG. 15A depicts a longitudinal view of an alternative silicon-member-plus-wire composite 1500. Conductive wires 1504 (again, the term "wire" is intended to cover wire and wire-like structures) are laminated on both the top and bottom of a silicon member 1508, which may be, for example, one of the silicon members 420 of FIG. 4N. Silicon member 1508 is then cut into sections, as depicted by representative cutting pattern 1512 to yield two sets of silicon-member-plus-wire 1516 as depicted in FIG. 15B. Those skilled in the art will readily appreciate that cutting pattern 1512 could be readily modified to create a multitude of geometries while yielding two silicon-member-plus-wire composites 1520, as depicted in FIG. 15C.

In the foregoing embodiment depicted in flow chart 500, step 540 includes growing a wet or dry thermal oxide layer 432 on epitaxial silicon layer 428. Typical wet or dry thermal oxides are grown in-situ at high temperatures between about 800° C. and about 1000° C. In other embodiments, this high-temperature oxidation step may be replaced with a lower temperature deposited oxide. Referring now to FIG. 5 and FIG. 16, FIG. 16 depicts a modified manufacturing method 1600 that incorporates the use of a lower-temperature deposited-oxide layer. As is evident from FIG. 16, step 1605 includes implementing steps 505-525 of method 500 (FIG. 5). At step 1610, active dopants 440 are implanted into silicon sections 436. At step 1615, metal layer 444 is deposited on the layer containing dopants 440. At step 1620, remaining masking layer 412 is etched to expose silicon section 436. At step 1625, exposed sections of the silicon wafer 436 are etched through the entire thickness of the wafer, and any residual photoresist 416 is removed so as to form silicon member 420. At step 1630, if desired, epitaxial silicon layer 428 is grown to reduce surface roughness of etched silicon surface 424. At step 1635 laminate conductive sheet 448 to metal layer 444 either on top and/or bottom surface. At step 1640, conductive sheet 448 is separated (e.g., cut) into ribbons (or wires) 452. At step 1645, silicon members 420 are detached (e.g., cut) from silicon wafer frame 422 (FIG. 4N). At step 1650, a lower-temperature insulator layer 432 is deposited. Note that in this embodiment, step 580 would be redundant. At step 1655, implement steps 585 and 590 are performed.

Figure 17A:
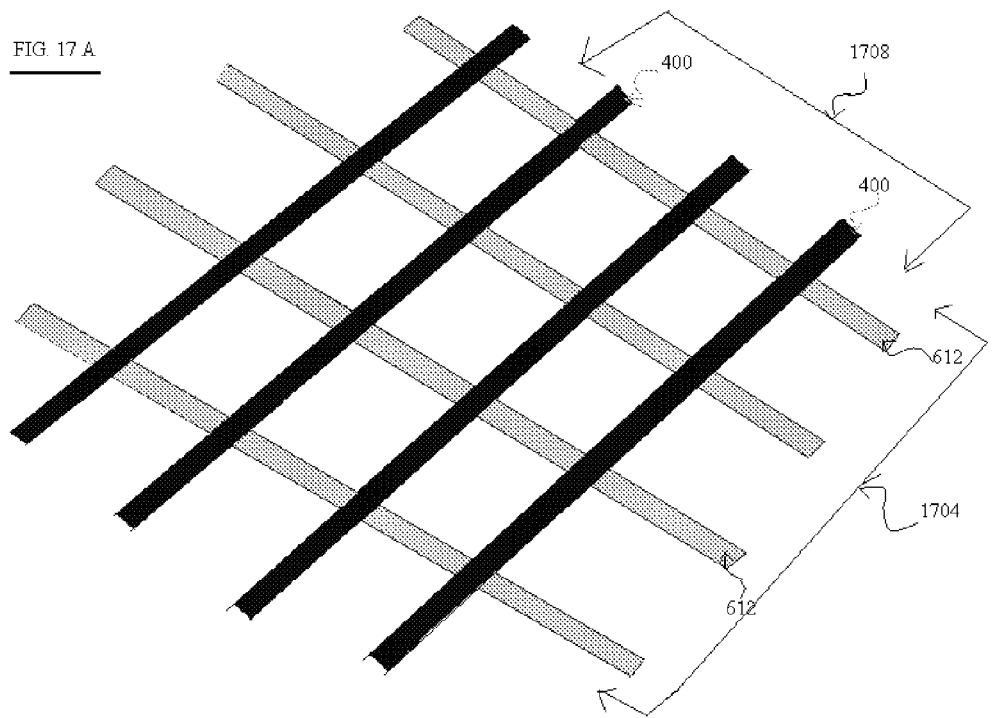
FIGS. 17A and 17B are perspective high-level schematic diagrams illustrating a plurality of AED strands in, respectively, a non-woven configuration and a woven configuration.
Figure 17B:
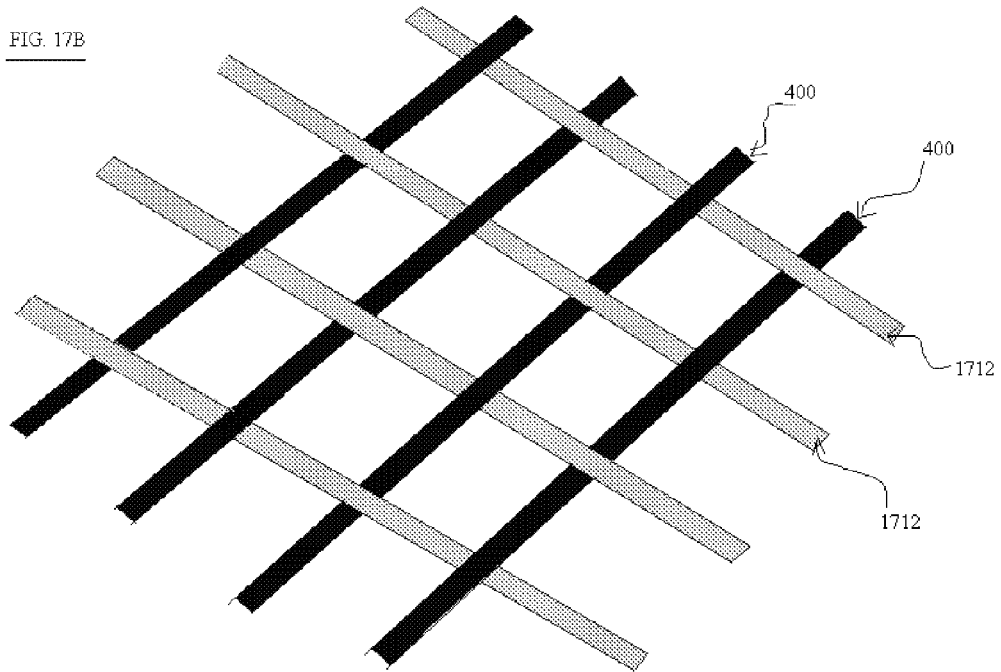

Referring again to FIG. 6A and FIG. 7, step 710 of FIG. 7 includes applying a gate metal layer 608 to substrate 604 and then patterning layer 608 into wires 612. At step 715 one or more sections of AED strand 400 are attached to substrate 604 such that metal layer 464 on AED strand 400 is in electrical communication with wires 612 (FIG. 6B). Referring now to FIGS. 17A-B, FIG. 17A is essentially a reproduction of FIG. 6A but depicting only the patterned wires 612 (FIG. 6B) and AED strands 400. As seen in FIG. 17A, patterned wires 612 may lie in one plane 1704 and AED strands 400 may lie in another plane 1708 that overlies plane 1704. This type of physical arrangement may also be thought of as a "non-woven" arrangement. In some embodiments, patterned wires 612 may be replaced by discrete conductors so as to form a non-woven fabric free of a permanent substrate. FIG. 17B, on the other hand, illustrates a woven arrangement of AED strands 400 and conductors 1712 that, in this example, pass over one AED strand and then pass under the next AED strand in a simple woven manner. Those skilled in the art will readily appreciate that other weaving arrangements and patterns may be used to suit a particular design.

Figure 18:
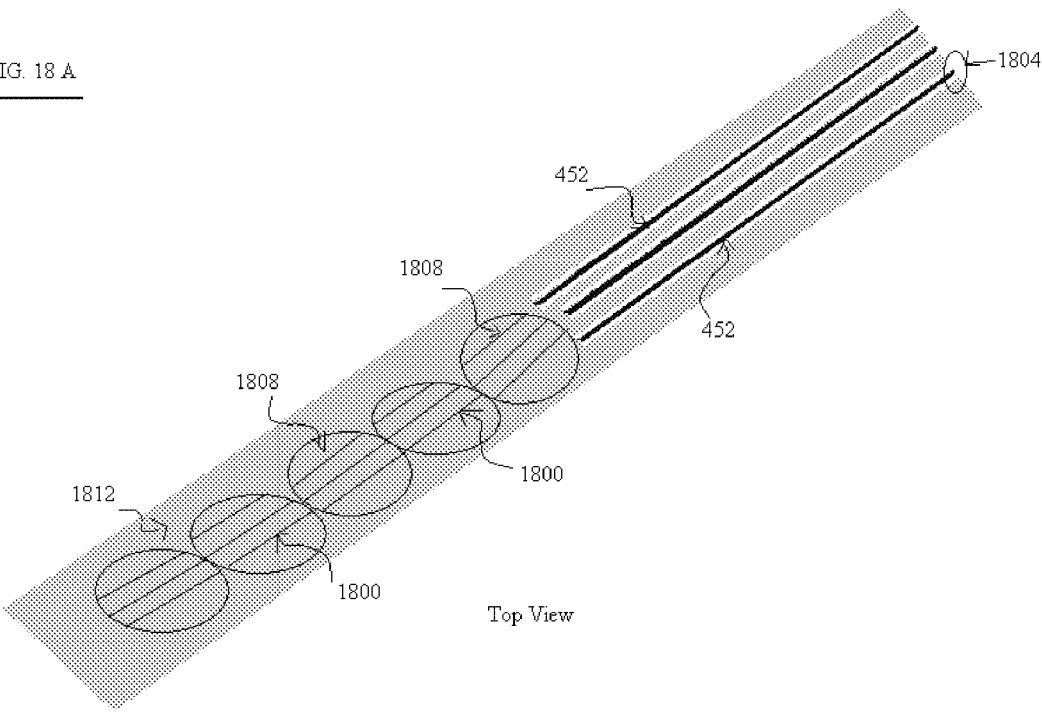
FIG. 18A is a perspective high-level schematic diagram of a continuous process that may be used to create AED strands of virtually any desired lengths.
FIG. 18B is a schematic diagram of feed and take-up spools of a roll-to-roll implementation of the continuous process of FIG. 18A.
Figure 18:
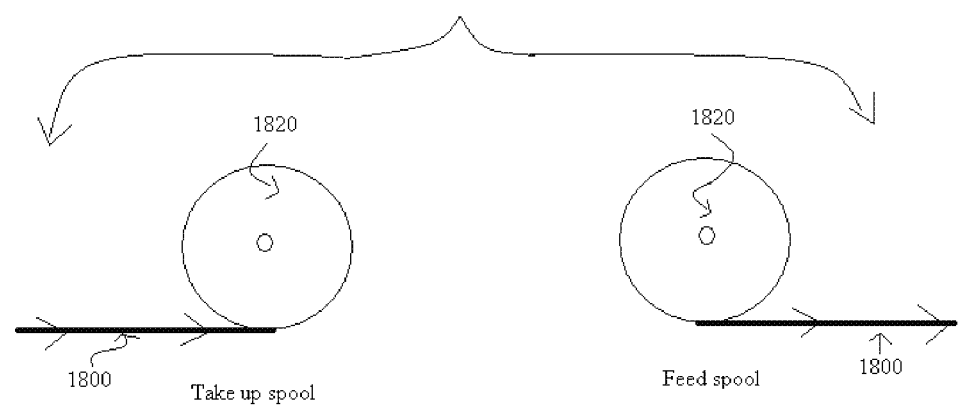

Referring to FIG. 5, and also to FIGS. 18A-B, as mentioned, step 575 of method 500 of FIG. 5 includes repeating steps 505-570 of the method so as to create long and substantially continuous wires of silicon-member-plus-wire composites 456 (FIG. 4O). FIG. 18A illustrates a continuous process in which a plurality of silicon members 1800 (each of which correspond to silicon members 420 of FIG. 4N) may indeed be formed into such long wire composites 1804. In this example, precursor structures 1808 each containing a plurality of silicon members 1800 are brought into proximity and then into contact with a continuous conductive layer 1812, which corresponds to conductive sheet 448 of FIG. 4L. An exemplary type of precursor structure suitable for use as precursor structures 1808 is the recessed-frame type shown in FIG. 13 as element 1300.

Referring briefly to FIG. 13, as mentioned above relative to FIG. 13, precursor structure 1300 has a recessed frame 1304 that would allow the opposing ends of silicon members 1308 to be directly butted to similar silicon members provided by other similar precursor structures. This is in contrast to the precursor structure shown in FIG. 4N in which the frame 422 is in the same plane as the silicon members 420 and thus may be less amenable to end-to-end processing of the members. That said, those skilled in the art will readily appreciate that the precursor structure shown in FIG. 4N could indeed be used in a continuous process to create long wire composites similar to long wire composites 1804.

At some point during the process, silicon members 1800 are laminated to conductive layer 1812 and the members are freed from the frame (not shown) of each precursor structure 1808, and not necessarily in that order. As shown in FIG. 18B, once liberated from precursor substrates, such as precursor structures 1808 of FIG. 18A, and further processed as desired, silicon members 1800 may be taken up by a spool 1820 and stored thereon until needed for further processing and/or use in another step of a process for manufacturing electronic articles that will incorporate the silicon members. For example, spool 1820 may be used to take up and store silicon members 1800 and conductive layer (element 1812 in FIG. 18A). Spool 1820 may then be taken to another processing station (not shown), where silicon members 1800 are paid out from the spool for further use. An example of such a processing station is a station in which silicon members 1800 are subject to one or more deposition and/or etching steps to form active electronic devices, or portions of such devices, thereon. Another example station is one in which silicon members 1800, which may have already been further processed, may be secured to a permanent substrate that will become part of the finished electronic articles.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A method of making an active electronic device strand, comprising:
   providing a precursor substrate;
   forming a plurality of elongate members from said precursor substrate, each of said elongate members having a length; and
   securing a plurality of elongate conductors, which exist prior to said securing, in a corresponding respective manner to said plurality of elongate members along said length so as to form a plurality of elongate composites each including an elongate conductor and an elongate member.

2. The method of claim 1, further comprising making a plurality of active electronic devices on each elongate composite of said plurality of elongate composites along said length.

3. The method of claim 2, wherein said making of said plurality of active electronic devices includes making a plurality of field-effect transistors.

4. The method of claim 3, wherein said making of said plurality of field-effect transistors includes making a portion of each of said plurality of field-effect transistors in a roll-to-roll process.

5. The method of claim 3, wherein said making of said plurality of field-effect transistors includes making a portion of each of said plurality of field-effect transistors in a substantially continuous roll-to-roll process.

6. A method of making an electronic component, comprising:
   forming a plurality of field-effect transistors in accordance with claim 3; and
   utilizing ones of said plurality of field-effect transistors in making an electronic component by interconnecting ones of said plurality of field-effect transistors together.

7. The method of claim 1, further comprising depositing an insulator layer over said plurality of elongate members.

8. The method of claim 7, further comprising selectively depositing an insulator layer over said plurality of elongate composites.

9. The method of claim 8, wherein said plurality of field-effect transistors comprise a corresponding respective plurality of active channel regions, the method further comprising conformally depositing a gate electrode layer laterally proximate each of said plurality of active channel regions.

10. The method of claim 1, wherein said securing of said plurality of elongate conductors includes securing a plurality of individual wires to said plurality of elongate members so that each of said plurality of elongate composites includes an individual wire and an elongate member.

11. The method of claim 1, wherein said securing of said plurality of elongate conductors comprises securing a conductive sheet to said plurality of elongate members and forming said plurality of elongate conductors by freeing said plurality of elongate composites from said conductive sheet.

12. The method of claim 11, wherein said freeing of said plurality of elongate composites includes cutting said conductive sheet.

13. The method of claim 1, wherein said forming of said plurality of elongate members includes forming said plurality of elongate members so that they remain attached to a frame portion of said precursor substrate.

14. The method of claim 13, wherein said precursor substrate has a thickness and said forming of said plurality of elongate members so that they remain attached to said frame portion includes removing portions of said precursor substrate through the entirety of said thickness so that said plurality of elongate members are attached to said frame portion at ends of said plurality of elongate members.

15. The method of claim 13, wherein said precursor substrate has a thickness and said forming of said plurality of elongate members so that they remain attached to said frame portion includes removing portions of said precursor substrate through a portion of said thickness so that each of said plurality of elongate members is attached to said frame portion along said length.

16. The method of claim 15, wherein said precursor substrate has opposite expansive sides and said removing of portions of said precursor substrate includes removing portions from both of said opposite expansive sides so as to form ones of said plurality of elongate members of both of said opposite expansive sides.

17. The method of claim 13, further comprising detaching said plurality of elongate members from said frame portion prior to completing said plurality of electronic devices.

18. The method of claim 1, wherein said providing of said precursor substrate includes providing a precursor substrate made of semiconducting material.

19. The method of claim 18, wherein said providing of said precursor substrate includes providing a substantially single-crystal substrate.

20. A method of making an electronic component, comprising:
forming a plurality of electronic device strands each in accordance with claim 1; and
incorporating said plurality of electronic device strands in an electronic component.

21. The method of claim 20, wherein the incorporating of said plurality of electronic device strands into said electronic component includes weaving a plurality of ones of said plurality of electronic device strands with a plurality of elongate conductors.

22. The method of claim 20, wherein the incorporating of said plurality of electronic device strands into said electronic component includes configuring ones of said plurality of electronic device strands relative to a plurality of elongate conductors in a non-woven manner.

23. A method of making an electronic component, comprising:
making an active electronic device strand in accordance with claim 1, said active electronic device strand having a length and comprising a plurality of active electronic devices located along said length, each of said active electronic devices including a source/drain layer and an active channel region comprising a plurality of free-standing semiconductor structures laterally surrounded by a gate insulator, wherein a gate metal layer is applied over said gate insulator;
providing a permanent substrate having a plurality of gate electrodes;
securing said plurality of active electronic devices to said permanent substrate so said gate metal layer of each of said plurality of active electronic devices is in electrical communication with a corresponding one of said plurality of gate electrodes;
substantially encasing said plurality of active electronic devices in an insulator layer; and
depositing a source/drain electrode layer over said insulator layer so that said source/drain electrode layer is in electrical communication with said source/drain layer of each of said plurality of active electronic devices.

24. The method of claim 1, further comprising further processing said elongate composite member so as to complete the active electronic device strand.

25. The method of claim 24, wherein said further processing of said elongate composite member includes selectively depositing an insulating layer on said elongate composite member, conformally depositing a metal gate layer over said insulating layer and patterning said metal gate layer.

26. A method of making an electronic component, comprising:
making an active electronic device strand in accordance with claim 1, said active electronic device strand having a circumference and a length and comprising a plurality of active electronic devices located along said length, each of said active electronic devices including a source/drain layer and an active channel region, a gate insulator layer atop said active channel region, and a gate metal layer around said circumference atop said gate insulating layer;
providing a permanent substrate;
securing said plurality of active electronic devices to said permanent substrate;
depositing a first insulator layer so as to substantially cover each of said plurality of active electronic devices;
depositing a gate electrode layer on said first insulator layer so that said electrode layer is in electrical communication with said gate metal layer of each of said plurality of active electronic devices;
depositing a second insulating layer atop said gate electrode layer; and
depositing a source/drain electrode layer over said second insulating layer so that said source/drain electrode layer is in electrical communication with said source/drain layer of each of said active electronic devices.

* * * * *